United States Patent
Volpe et al.

(10) Patent No.: US 10,593,380 B1
(45) Date of Patent: Mar. 17, 2020

(54) PERFORMANCE MONITORING FOR STORAGE-CLASS MEMORY

(71) Applicant: Amazon Technologies, Inc., Seattle, WA (US)

(72) Inventors: Thomas A. Volpe, Austin, TX (US); Mark Anthony Banse, Austin, TX (US); Steven Scott Larson, Georgetown, TX (US); Douglas Lloyd Mainz, Cedar Park, TX (US)

(73) Assignee: Amazon Technologies, Inc., Seattle, WA (US)

( * ) Notice: Subject to any disclaimer, the term of this patent is extended or adjusted under 35 U.S.C. 154(b) by 21 days.

(21) Appl. No.: 15/840,717

(22) Filed: Dec. 13, 2017

(51) Int. Cl.
*G06F 11/30* (2006.01)
*G11C 7/22* (2006.01)
*G06F 13/16* (2006.01)
*G06F 17/18* (2006.01)

(52) U.S. Cl.
CPC ............ *G11C 7/22* (2013.01); *G06F 11/3037* (2013.01); *G06F 13/1668* (2013.01); *G06F 17/18* (2013.01)

(58) Field of Classification Search
CPC .. G06F 11/3034; G06F 13/1668; G06F 17/18; G11C 7/22
See application file for complete search history.

(56) References Cited

U.S. PATENT DOCUMENTS

| | | | |
|---|---|---|---|
| 9,432,298 B1* | 8/2016 | Smith | H04L 49/9057 |
| 2016/0170882 A1* | 6/2016 | Choi | G06F 12/0806 |
| | | | 711/119 |
| 2017/0277643 A1* | 9/2017 | Zhou | G06F 13/24 |

* cited by examiner

*Primary Examiner* — Reginald G Bragdon
*Assistant Examiner* — Edward Wang
(74) *Attorney, Agent, or Firm* — Kilpatrick Townsend & Stockton LLP

(57) ABSTRACT

Disclosed herein are techniques for monitoring the performance of a storage-class memory (SCM). In some embodiments, a performance monitoring circuit at an interface between the SCM and a memory controller of the SCM receives transaction commands from the memory controller to the SCM, measures statistics associated with the transaction commands, and determines a utilization rate of the SCM based on the statistics. Based on the determined utilization rate of the SCM, future transaction requests can be optimized to improve the utilization rate of the SCM.

20 Claims, 12 Drawing Sheets

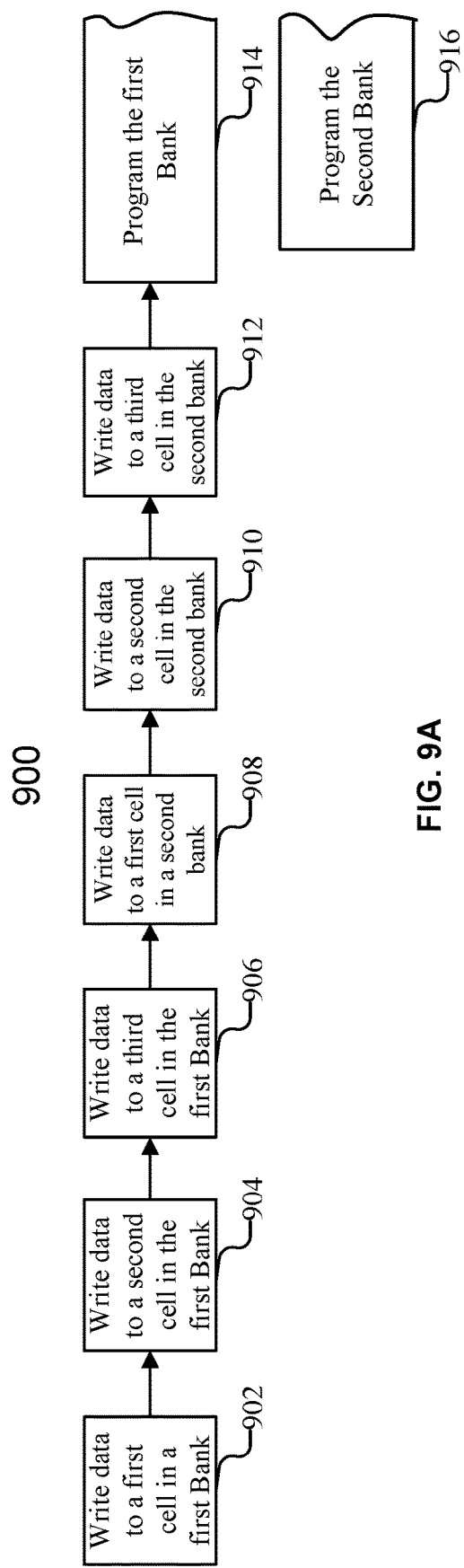
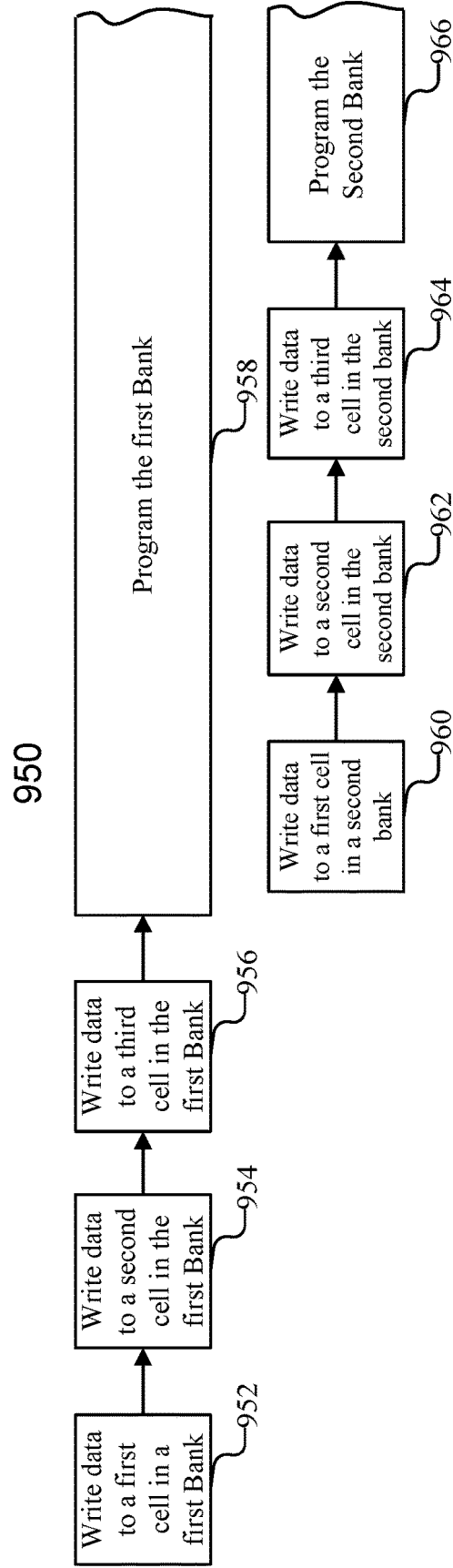
FIG. 9A
FIG. 9B

PERFORMANCE MONITORING FOR STORAGE-CLASS MEMORY

BACKGROUND

High speed, high density, high endurance, and low cost memory devices are desired in a modern computer system in order to improve the overall performance of the computer system.

Dynamic random-access memory (DRAM) has low latency, short access time, and high endurance. However, the size of DRAM in a computer system is generally limited due to, for example, relatively high cost and difficulty in making large DRAM chips or modules. An electrically accessible non-volatile or persistent memory, often referred to as storage-class memory (SCM), which combines the benefits of DRAM (e.g., high performance and robustness) with the persistent capabilities and low cost of conventional solid-state storage, has been developed and is beginning to be used in modern computer systems, including network-based computer systems.

BRIEF DESCRIPTION OF THE DRAWINGS

Various embodiments in accordance with the present disclosure will be described with reference to the drawings, in which:

FIG. 9A illustrates an example reordered sequence of SCM memory transactions, according to some aspects of the present disclosure;

FIG. 9B illustrates an example reordered sequence of SCM memory transactions, according to some aspects of the present disclosure;

DETAILED DESCRIPTION

Figure 1:
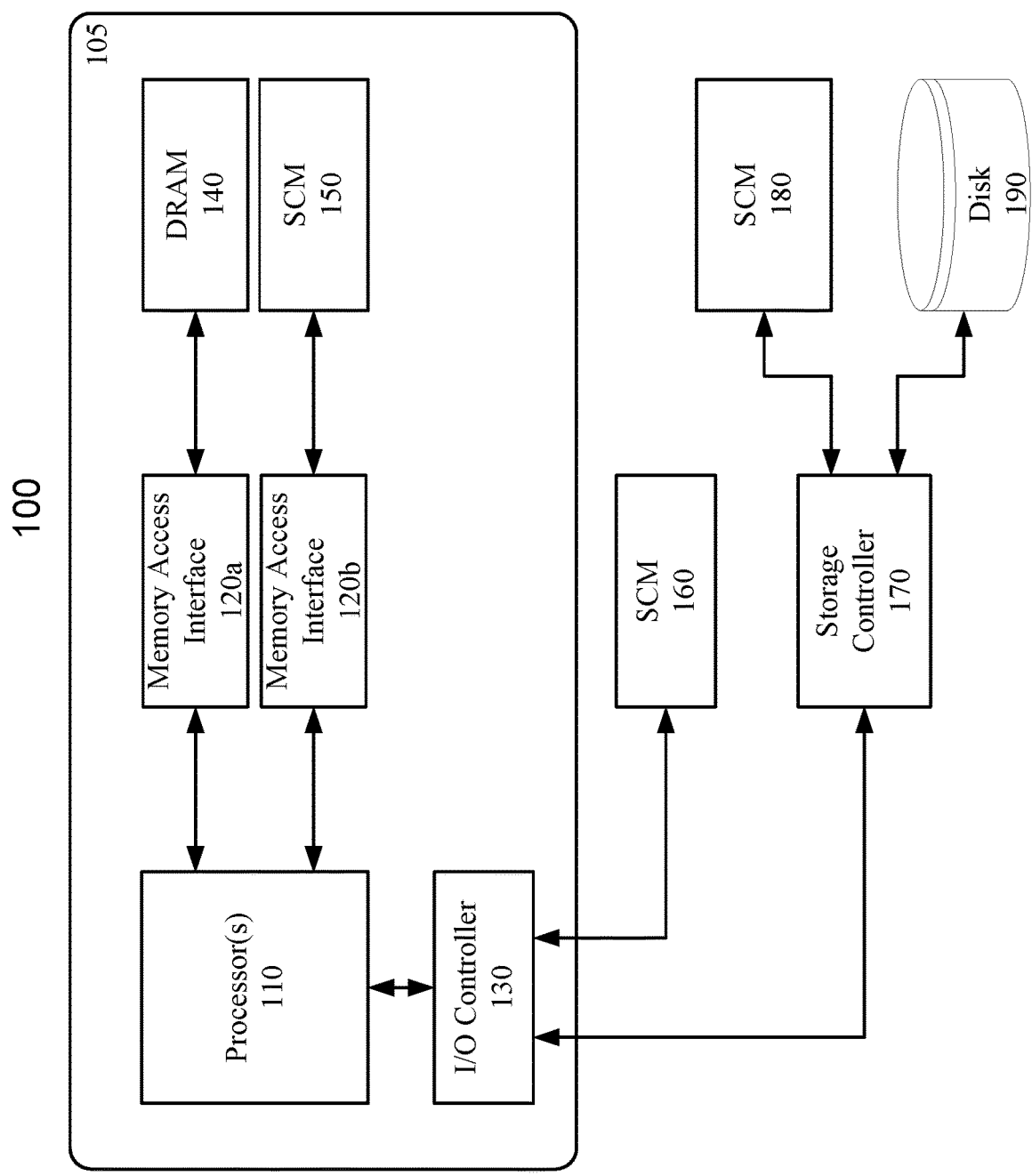
FIG. 1 is a simplified block diagram of an example computer system using storage-class memory (SCM), according to some aspects of this disclosure.

Embodiments of the present disclosure provide methods, systems, computer-readable media, and operations for measuring and improving the performance of a memory subsystem using storage-class memory (SCM) on a computer system. In one embodiment, a circuit may be used to measure the performance (e.g., utilization rate or idle time of an SCM bus) of an SCM memory subsystem on a computer system. For example, a memory controller for the SCM may include a performance measurement (or monitoring) circuit at an interface between the memory controller and the SCM for measuring the SCM bus utilization. The measured performance may then be used by a memory controller to improve the performance of the SCM memory subsystem by reordering future memory transactions or changing the memory mapping. The measured performance may also be used by a software application to improve the performance of the memory subsystem by changing the sequence of memory access requests. The measured performance may also be used to monitor the effectiveness of the transaction reordering, memory remapping, and/or software changes. The transaction reordering, memory remapping, and/or software changes that may improve the performance of the SCM memory subsystem may also reduce the overall program/erase operations on the SCM, and therefore the overall endurance or lifetime of the SCM memory subsystem may be improved as well.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

One challenge in computer systems is the need for memory technologies that can improve overall performance and reduce cost. Dynamic random-access memory (DRAM) is known for high performance and low capacity, and for being relatively expensive. Thus, a computer system may only have enough DRAM memory space to store a fraction of the total data set that the processor(s) of the computer system may need to operate on. In addition, DRAM memory is volatile, and thus, if the computer system crashes or loses power, data stored in the DRAM memory will be lost. Therefore, most data is kept on storage devices, such as solid-state drives (or disks) (SSDs) or hard disk drives (HDD), which may have higher capacity and lower cost, but a much lower performance than DRAM. Storage-class memory (SCM) is a new hybrid storage/memory tier with particular characteristics. Physically, it may be connected to memory slots in a motherboard like DRAM (e.g., in the form of dual in-line memory modules (DIMMs)), and may be managed and accessed like DRAM. SCM can have a much smaller size (e.g., ⅕ to ⅓ of the size of a DRAM with the same capacity) and much higher capacity and lower cost than DRAM. SCM may have a read latency of, for example, about 300 ns to about 500 ns, which may be longer than the read latency of DRAM (e.g., about 50-100 ns), but is much shorter than the read latency of NAND Flash (e.g., about 100 μs). While current SCM may be slightly slower than DRAM, it has a higher capacity and lower cost, and is persistent like traditional storage devices so that its content is preserved during power cycles. Therefore, SCM technology may enable a computer system to have a large, high performance, low cost, and persistent memory sub system.

However, SCM may have a limited lifetime dictated by the number of write operations, often referred to as program/erase (P/E) cycles, that can be performed on the SCM. On the other hand, a computer system, such as a server, may receive thousands or millions of read and write requests from users, and thus may require a memory subsystem having a high endurance in order to meet the needs of some write-intensive applications. Thus, for a server using SCM, it is desirable to minimize the write operations to each page or subpage of the memory while meeting the needs of users.

In addition, SCM may have a relatively long write latency in order to persist the data, during which time data may not be read from or written to the SCM. Therefore, requests to read from or write to the SCM may need to be put on hold even though the bus and/or the interface to the SCM may not be used. This may prevent an SCM memory subsystem from achieving an optimum or desired performance.

Techniques for measuring and improving the performance of an SCM memory subsystem on a computer system are described in the present disclosure. SCM memory subsystem performance, such as the utilization rate and idle time of an SCM bus in the SCM memory subsystem on a computer system, may be measured by, for example, a performance monitoring circuit in a memory controller. The measured performance can be used by the memory controller or a software application to improve the performance of the SCM memory subsystem through transaction reordering, memory remapping, and/or software changes. The measured performance may also be used to monitor the effectiveness of the transaction reordering, memory remapping, and/or software changes.

A computer system, such as a computer server or a network-based computing system, uses memory to store information that it will need immediate access to. It uses storage, on the other hand, to store information that it may act on, but does not need at a specific moment in time. Memory, typically static random access (SRAM) or DRAM, may have high performance, low capacity, and high cost, and may be volatile. Storage, typically hard disk drives (HDDs) or solid-state drives (SSDs), may have high capacity, affordability, and much lower performance than DRAM, and may be non-volatile. For decades, applications have stored data temporarily in DRAM. At specific execution points, data is typically reformatted and placed into 512-byte or 4096-byte blocks (sometimes referred to as storage sectors), and then written (along with metadata) to disks structured as either file systems or databases for persistence. Ideally, the memory subsystem of a computer system would be sufficiently large to store all the data that will be needed, sufficiently fast for almost immediate data access, non-volatile such that data may not be lost when power is lost, and low-cost to be economically practical.

Storage-class memory, such as some flash or non-flash non-volatile memory (NVM), is a type of memory that has capacity and cost that are similar to storage devices (e.g., HDD) but with performance that is similar to memory devices (e.g., DRAM). SCM combines the benefits of DRAM memory, such as high performance and robustness, with the persistent capabilities and low cost of conventional solid-state or hard-disk magnetic storage. Because SCM is non-volatile, the content stored on it remains in the memory, not only in the case of planned power down or reboots, but also during unplanned crashes and downtime. SCM may be addressed at either a byte or a block level. Because SCM is byte-addressable, data may not need to be packaged into coherent 512-byte blocks. By keeping the most up-to-date content with byte-level granularity, while eliminating the intermediate copy, SCM may simplify the computer architecture and operating system, greatly improve the performance of the computer system, and give operating systems, software, and/or hypervisor developers significant flexibility. An operating system may treat SCM as block storage devices formatted by file systems and databases for compatibility purposes. Hypervisors may map isolated SCM regions directly to different virtual machines (VMs) as either execution memory or a flash-like storage resource, and maintain a memory mapping file or table. It is noted that even though some embodiments in the present disclosure may be described with respect to non-virtualized environments only, techniques disclosed herein may be used in both virtualized environments and non-virtualized environments.

SCMs may have limited write lifetime, i.e., SCMs may only handle a limited number of write cycles, such as, for example, 1 million or 10 million or less, before wearing out or becoming unusable. The number of write cycles that can be performed on an SCM before the SCM becomes unusable or unreliable may be referred to as "write endurance." Different types of SCM may have different write endurance characteristics. SCM write endurance may also be described in terms of full Device Writes Per Day (DWPD) for a certain warranty period (typically 3 or 5 years). In other words, if a 100-gigabyte (GB) SSD or SCM device is specified for 1 DWPD, it can withstand 100 GB of data written to it every day for the warranty period. Thus, if a 100-GB SSD or SCM device is specified for 10 DWPD, it can withstand one terabyte (TB) of data written to it every day for the warranty period. Another metric that is used for device write endurance is Terabytes Written (TBW), which is used to describe how much data can be written to the device over the lifetime of the drive. The higher the TBW value, the better the endurance of the device. These specifications generally assume that data is written to the device substantially evenly or uniformly, or there is an underlying mechanism, hidden from the user, that will spread the write operations substantially evenly.

In addition, to write data to an SCM unit (e.g., an SCM bank), the SCM unit may need a relatively long time period to persist the data in order to complete the SCM write operation before the data written to the SCM unit can be accessed (i.e., read). An SCM module may have a write latency of, for example, about 4 μs or longer. During the data persisting, data may not be read from or written to the SCM unit (e.g., an SCM bank) that is being persisted. Therefore, other requests to read from or write to the SCM unit that is being persisted may need to be put on hold even though the bus and/or the interface to the SCM are not being used. Requests to read from or write to other SCM units may also be put on hold before the write operation completes. This may significantly impact the performance of the memory subsystem using SCM.

FIG. 1 is a simplified block diagram of an example computer system 100 using storage-class memory, according to some aspects of this disclosure. Computer system 100 may include one or more processors 110, one or more memory access interfaces 120a and 120b (e.g., memory controllers), and an input/output (I/O) controller 130 coupled to processor(s) 110. In some implementations, these components may be on, for example, a motherboard 105, a card, or a system unit of computer system 100.

Memory access interfaces 120a and 120b may include memory hubs used to manage and control the access to the memory subsystem (or main memory) on computer system 100. The memory subsystem (or main memory) may include, for example, DRAM 140 and/or SCM 150. In general, DRAM 140 and SCM 150 may not be on the same chip as processor(s) 110 or memory access interfaces 120a and 120b. In some embodiments, the memory subsystem may include several levels of cache hierarchy (not shown), such as Level 1 (L1) caches, Level 2 (L2) caches, Level 3 (L3), or last level caches. DRAM 140 may include, for example, dynamic random-access memory (DRAM) or synchronous dynamic random-access memory (SDRAM), such as double data rate (DDR), DDR2, DDR3, or DDR4 SDRAM, of various sizes. SCM 150 may be a random access memory-type non-volatile SCM, such as certain types of resistive RAM memory, that has a read latency of, for example, less than about 1 microsecond (μs) (e.g., about 400 ns). Example of memory-type SCM may include conductive bridging RAM (CBRAM), phase-change memory (PCM), resistive random-access memory (RRAM or ReRAM), or spin-transfer torque (magnetic) random-access memory (STT-RAM or STT-MRAM), etc.

I/O controller 130 may be coupled to a storage controller 170. Storage controller 170 may implement, for example, a Peripheral Component Interconnect (PCI)-based protocol, UltraPath Interconnect (UPI), Advanced eXtensible Interface (AXI), Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. For example, storage controller 170 may control a disk 190, which may be, for example, a SCSI, SAS, or SATA-based hard-drive disk (HDD). Storage controller 170 may also control a storage-type SCM 180, such as a solid-state drive (SSD), using, for example, the NVMe protocol. Storage-type SCM 180 may include, for example, resistive memory.

In some embodiments, an SCM 160 may also be directly connected to I/O controller 130 without going through a storage controller. SCM 160 may include any of the memory-type SCM or storage-type SCM described above, and may have a read latency of, for example, less than 20 μs or less than 10 μs for a block of data.

Figure 2:
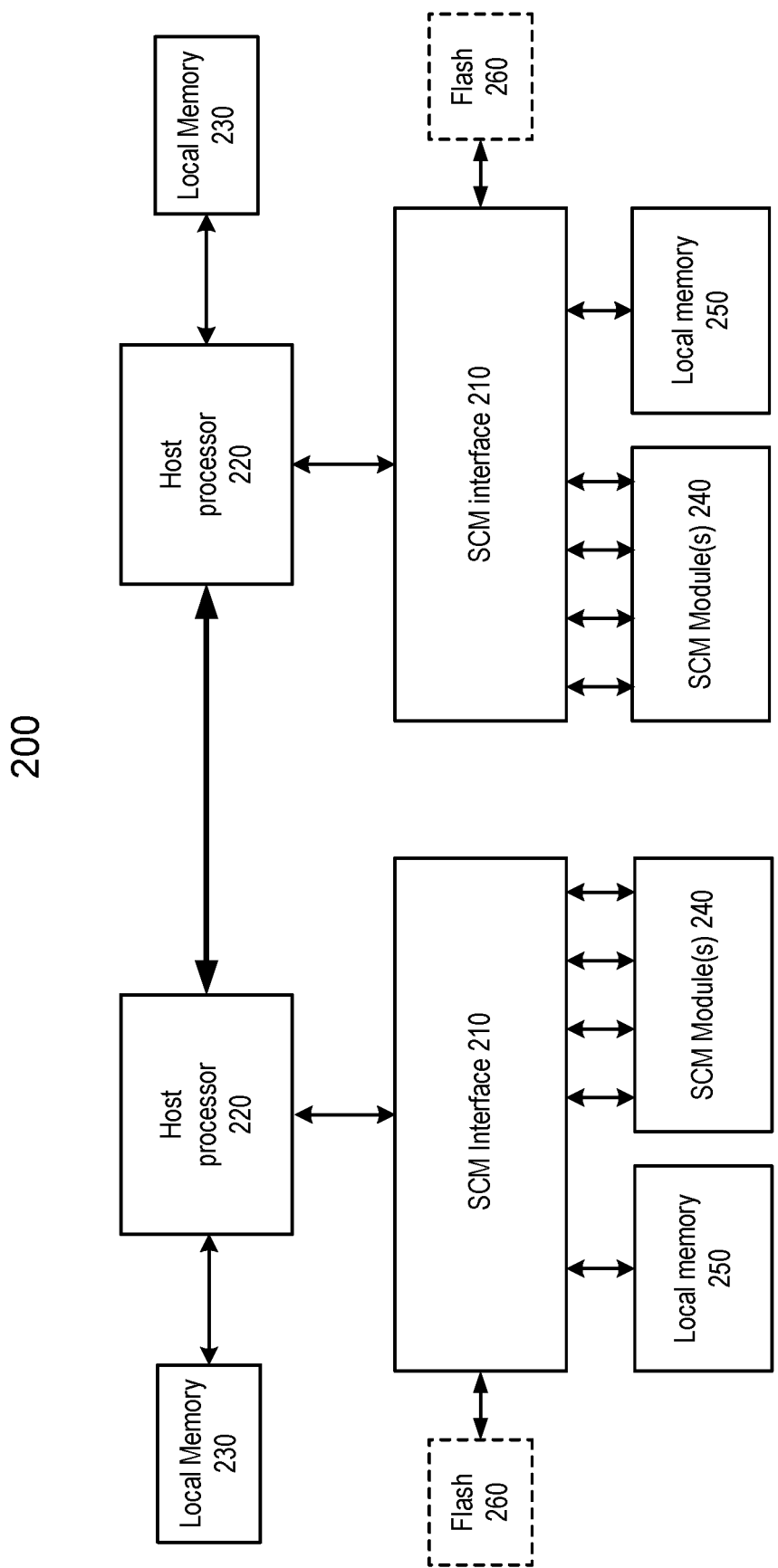
FIG. 2 is a simplified block diagram of an example computer server, according to some aspects of this disclosure.

FIG. 2 is a simplified block diagram of an example computer server 200, according to some aspects of this disclosure. Many components or modules of server 200 may be omitted in FIG. 2 in order not to obscure the features being described herein. One skilled in the relevant art will appreciate that the disclosed illustrative components are not meant to be an exhaustive identification of all the components required by or present in a server. Rather, illustrative components have been identified, in a non-limiting manner, to facilitate illustration of one or more aspects of the present disclosure. Still further, the illustrative components of server 200 may be logical in nature such that the physical implementation of one or more components can be varied or such that one or more of the logical components may be implemented in a virtualized manner. Additionally, one or more servers 200 may share one or more of the illustrated or unillustrated components, such as processors, graphical processing units, memory, storage, and the like.

In an illustrative embodiment, server 200 may be associated with various hardware components, software components, and respective configurations that facilitate the execution of client applications. In some implementations, server 200 may provide a multi-tenant platform to multiple clients. In some embodiments, server 200 may be dedicated to a client at a given time, while no other client may have access to server 200 at the same time.

Server 200 may include any number of host processors 220 as appropriate, each host processor 220 communicatively coupled to multiple channels of local memory (e.g., DRAM) and SCM modules. In the example shown in FIG. 2, server 200 may include two host processors 220 and associated memory devices. The two host processors 220 may be connected to each other using, for example, Ultra-Path Interconnect (UPI). Each host processor 220 may include application specific integrated circuits (ASICs), field programmable gate arrays (FPGAs), systems-on-chip (SoCs), network processing units (NPUs), processors configured to execute instructions, graphic processing units (GPUs), or any other circuitry configured to perform logical arithmetic and floating point operations. Examples of processors that may be included in host processor 220 may include processors developed by ARM®, MIPS®, AMD®, Intel®, Qualcomm®, NVIDIA®, and the like. In certain implementations, host processor 220 may include multiple processors or processing cores, wherein each processing core may be configured to execute instructions independent of other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores, or processing threads executing on the same core may share certain resources, such as, for example, buses, level 1 (L1) caches, and/or level 2 (L2) caches. The instructions executed by host processor 220 may be stored on a computer-readable storage medium, for example, in the form of a computer program.

Each host processor 220 may be coupled to a local memory 230, which may include at least some instructions that can be executed by host processor 220. In some implementations, local memory 230 may include firmware that may cause components of server 200 to initialize and identify system devices, such as the video display card, keyboard and mouse, hard disk drive, optical disc drive, and other hardware. In some embodiments, local memory 230 may include volatile memory device including, for example, a random access memory (RAM), dynamic random access memory (DRAM), or a synchronous dynamic random-access memory (SDRAM), such as double data rate (DDR), DDR2, DDR3, or DDR4 SDRAM. In some embodiments, local memory 230 may also include several levels of cache hierarchy, such as Level 1 (L1) caches, Level 2 (L2) caches, Level 3 (L3) caches, or last level caches. Although FIG. 2 illustrates local memory 230 as a single device, it is understood that local memory 230 may include two or more memory devices, each of which can be, for example, a DDR DIMM, and can be connected to two or more DIMM sockets on a motherboard of server 200 (not shown in FIG. 2). The DIMM sockets can be electrically coupled with host processor 220 via a set of high speed buses.

Each host processor 220 may also be communicatively coupled to one or more SCM modules 240 and a local memory 250 through an SCM interface 210. SCM modules 240 can be used to provide storage for data and instructions to be used by host processor 220. For example, as discussed above, SCM modules 240 can act as an auxiliary DRAM device to provide backup for local memory 230, store instructions and/or a large amount of operation data, or provide bulk data storage as a hard drive. SCM modules 240 may include, for example, flash-based NAND devices, RRAM devices, CBRAM devices, PCM device, STT-RAM devices, etc. SCM modules 240 may be in the form of DIMMS that can be connected to DIMM sockets on a motherboard, where the DIMM sockets may be electrically coupled with SCM interface 210 via a set of high speed buses.

SCM interface 210 may include an FPGA, an ASIC, an SoC, or other circuitries, and can provide an interface between host processor 220 (and local memory 230) and SCM modules 240. SCM interface 210 may include interface circuitries (e.g., receivers, transmitters, signal-conditioning circuits, associated controllers, etc.) for transmitting or receiving sequences of signals (e.g., representing physical addresses and data) between host processor 220 and SCM modules 240. SCM interface 210 may establish one or more communication channels between host processor 220 and SCM modules 240 via various high speed buses. For example, SCM interface 210 may be electrically coupled with host processor 220 via a set of high speed buses including, for example, Peripheral Component Interconnect Express (PCIe) buses, Intel® UltraPath Interconnect (UPI) buses, etc.

SCM interface 210 may manage accesses to SCM modules 240 through one or more SCM channels. Each channel may be used to access one or more SCM modules 240. SCM interface 210 may map between a set of logical addresses used by host processor 220 and a set of physical addresses in SCM modules 240. The set of logical addresses can be virtual addresses managed by, for example, operating systems operating on host processor 220. The set of physical addresses can be associated with one or more regions of SCM modules 240. When SCM interface 210 receives a request accompanied by a logical address to access SCM modules 240, SCM interface 210 may allocate physical memory space in SCM modules 240 and translate the logical address into a physical address of the SCM modules 240 based on the mapping, and transmit signals carrying the physical address to SCM modules 240 to perform a write operation or a read operation in a region of SCM modules 240. In various embodiments, SCM interface 210 may also perform other control and management functions, such as direct memory access (DMA), data encryption and decryption, error correction coding (ECC), security control, and data logging.

SCM interface 210 may also be coupled to a local memory 250. Local memory 250 may include volatile memory devices (e.g., RAM) and non-volatile memory devices (e.g., ROM) to store various data to support the operations of SCM interface 210. For example, local memory 250 may store the mapping information between logical addresses and physical addresses, which can be retrieved by SCM interface 210 to perform address mapping for processing the access requests to SCM modules 240 from host processor 220, DMA engines, etc. As another example, local memory 250 may provide temporary storage for migration of data within SCM modules 240. Local memory 250 may also be used to store other management data structures for managing the SCM modules, such as block write/read counters and measured data for performance monitoring and/or wear leveling.

In some implementations where SCM interface 210 is implemented on an FPGA, a non-volatile memory, such as a flash memory 260, may be coupled to SCM interface 210 through, for example, a Serial Peripheral Interface (SPI) interface. Flash memory 260 may store FPGA image file (e.g., netlist information) and firmware for booting and configuring the FPGA to implement the aforementioned functionalities of SCM interface 210. In some implementations, the firmware may be embedded in the FPGA image file.

Figure 3:
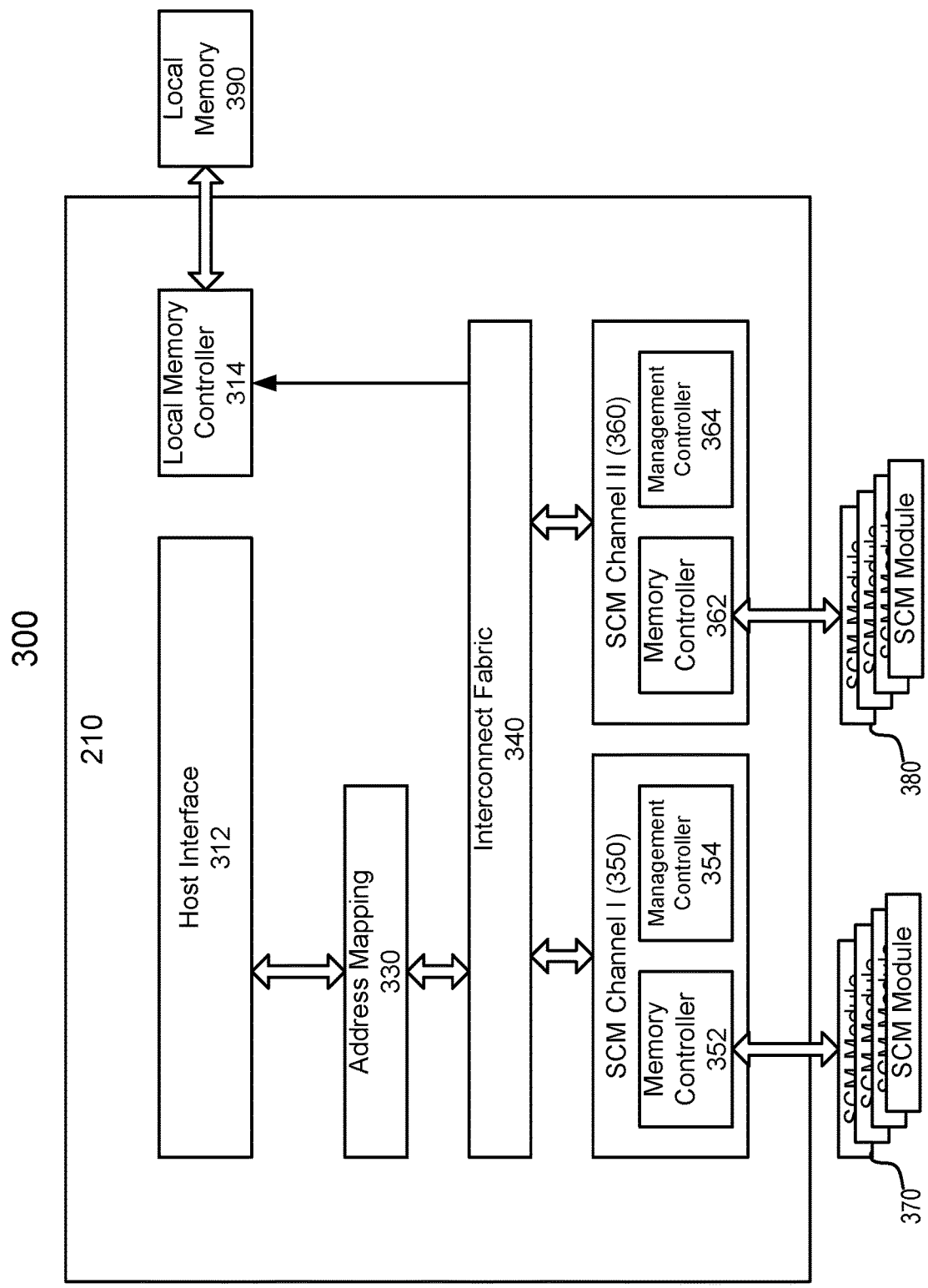
FIG. 3 is a simplified block diagram of an example SCM interface between a processor and SCM modules, according to some aspects of this disclosure.

FIG. 3 is a simplified block diagram 300 illustrating an example implementation of SCM interface 210 of FIG. 2 between a host processor and SCM modules, according to some aspects of this disclosure. In the example implementation shown in FIG. 3, SCM interface 210 may include a host interface 312, a local memory controller 314, an interconnect fabric 340, and one or more SCM channels, such as SCM channel I (350) and SCM channel II (360).

Host interface 312 may process requests to access to the SCM modules from different sources. For example, host interface 312 may include interfaces for high speed buses (e.g., PCIe, UPI, etc.), and may receive access requests (e.g., read or write) from host processor 220 via these high speed buses. Host interface 312 can also process access requests from, for example, a memory management unit (MMU) of server 200 (not shown) as part of a direct memory access (DMA) scheme. The MMU may accept an access request including a logical address provided by, for example, a virtual machine instance or the hypervisor operating on host processor 220, and forward the access request together with the local address to SCM interface 210 through host interface 312. SCM interface 210 may then process the access request, and transmit the requested data (e.g., for a read operation), as well as a status of processing the access request, back to host processor 220 or the MMU. Host interface 312 may communicate with interconnect fabric 340 through, for example, one or more Advanced Extensible Interface (AXI) interfaces.

Local memory controller 314 may be connected to a local memory 390, which may include, for example, a DRAM device. As described above with respect to local memory 250, local memory 390 may store the mapping information between logical addresses and physical addresses, which can be retrieved by SCM interface 210 to perform address mapping for processing the access requests to the SCM modules from host processor 220, DMA engines, etc. In some embodiments, local memory 390 may provide temporary storage for migration of data within the SCM modules. In some embodiments, local memory 390 may also be used to store other management data structures for managing the SCM modules, such as data measured for performance monitoring and/or wear leveling (e.g., block write/read counts).

Host interface 312 may communicate with interconnect fabric 340 through, for example, one or more AXI interfaces. Interconnect fabric 340 may be used to forward the requests and associated data (for example, data to be written to the SCM modules) from different bus interfaces and sources to different SCM channels, and forward data read back from different SCM channels to different bus interfaces and sources.

In some implementations, SCM interface 210 may include an address mapping circuit 330. Address mapping circuit 330 may be used, for example, to scramble address bits for security and for performance reasons. For example, address mapping circuit 330 may perform scrambling of a logical address associated with an access request, and use the scrambled logical address for translation to physical addresses for accessing the SCM modules. In some embodiments, the scrambling can be based on random numbers generated by an internal random number generator. The randomized scrambling of logical addresses can improve security by, for example, making it more difficult for an intruder to trace an access pattern to the SCM modules, based on which the intruder might be able to deduce the memory locations that store important data for a particular application. Some address scrambling may be VM specific and some address scrambling may apply to all VMs in order to disguise access patterns. Some address scrambling may be performed to spread memory access across multiple SCM Channels for improved average bandwidth, latency, and wear leveling. In some implementations, address mapping circuit 330 may include an address translation circuit and a translation lookaside buffer (TLB) for address translation from machine physical addressed to SCM physical addresses. In some implementations, some of address mapping circuit 330 (e.g., circuit for address scrambling) may be between host interface 312 and interconnect fabric 340, and some of address mapping circuit 330 (e.g., circuit for address translation) may be between interconnect fabric 340 and an SCM channel.

Each SCM channel, such as SCM channel I (350) or SCM channel II (360), may include a memory controller (e.g., memory controller 352 or 362), a management controller (e.g., management controller 354 or 364), and a physical layer (PHY) (not shown in FIG. 3) for controlling the access to one or more SCM modules. Memory controller 352 or 362 may provide a hardware interface to SCM modules 370 or 380 for performing write and read operations to SCM modules 370 or 380. Memory controller 352 or 362 may also perform the write and read operations (or decline to perform the operations) to implement various management operations, such as SCM device signaling, forward error correction calculation and correction, encryption/decryption, transaction buffering and/or reordering, write failure handling, ECC generation and scrubbing, refresh, or any combination thereof. Management controller 354 or 364 may perform management functions, such as memory allocation/deallocation, address translation (machine physical address to SCM device address), dynamic and static wear leveling, failed write management, temperature management, and interfacing with hypervisor, alone or in conjunction with memory controller 352 or 362.

For example, SCM channel I (350) or II (360) may perform various operations to improve the integrity of data stored at the SCM modules. For example, the memory controller and/or the management controller of an SCM channel may maintain a statistics log including accumulative write counts for at least some of the physical addresses associated with the SCM modules, and may maintain a history of write operations performed to the SCM modules. The memory controller and/or the management controller of an SCM channel may also implement a pre-determined wear-leveling policy for the SCM modules based on the accumulative write count information in the statistics log. For example, the memory controller and/or the management controller of an SCM channel may update the mapping between the logical addresses and physical addresses to direct the write operations to regions of the SCM modules associated with lower accumulative write counts. With such arrangements, the write operations can be more evenly distributed among different regions of the SCM modules, which can extend the lifetime of the SCM modules.

Further, the memory controller and/or the management controller of an SCM channel can also perform other operations to reduce the likelihood of data error at the SCM modules. For example, the memory controller and/or the management controller may determine that a region of the SCM modules has a low reliability based on a set of metrics including, for example, the accumulative write counts, write failure rate, etc. The accumulative write counts may refer to a number of successful write operations (where the stored data matches the write data) performed on a particular region of the SCM modules. A write failure, on the other hand, may refer to a scenario where the stored data does not match the write data, and the data error is not correctable (e.g., based on error correction codes (ECC), or other schemes). Based on such a determination, the memory controller and/or the management controller may copy or move the data stored in that region to another region of the SCM modules associated with a relatively higher reliability (based on the same set of metrics) to reduce the likelihood of data error caused by the potentially defective SCM devices. In addition, the memory controller and/or the management controller can also perform various error correction schemes to further reduce the likelihood of data error. For example, the memory controller and/or the management controller can generate and store error correction codes (ECC) based on the stored data. In one example, the memory controller and/or the management controller may employ a Reed-Solomon (RS) algorithm to generate error correction symbols based on pre-determined chunks (e.g., 64 bytes) of stored data, and store the error correction symbols with the chunks of data. The memory controller and/or the management controller may also perform a data scrubber process, in which the system can perform periodical verification of the stored data and correct any data error based on the error correction symbols stored in the SCM modules.

The memory controller and/or the management controller can also perform various operations to improve the security of the SCM devices. For example, for each write operation, the memory controller may encrypt the data before storing the data to the SCM modules. In some embodiments, the encryption can be based on a combination of a first key provided by a virtual machine instance and a second key generated by an internal random number generator. The memory controller and/or the management controller can also maintain a mapping between the virtual machine instance and the second key in order to retrieve the second key to decrypt the stored data for future read operations.

Moreover, the memory controller and/or the management controller may also detect potential malicious attack by detecting anomalous SCM access patterns by an application or a virtual machine instance. For example, the memory controller and/or the management controller may track the accumulative write counts by a virtual machine instance. If the number of accumulative write counts exceeds a pre-determined threshold, the memory controller and/or the management controller may determine that the write operations requested by that virtual machine instance are potentially part of a malicious attack to damage the SCM modules (e.g., by requesting a high volume of write operations to exceed the write endurance limit), or to overwhelm SCM interface 210 such that other accesses to the SCM modules may be denied or delayed. As part of a write policing operation, SCM interface 210 may take various preventive measures based on the detection of the potential malicious attack. For example, SCM interface 210 may deny further write access requests from that virtual machine instance, transmit a notification to an administrator, etc.

Each of SCM modules 370 or 380 may include one or more packages, where each package may include one or more dies or chips. The dies may include various organizations of different numbers of different structural units, such as cores, groups, banks, arrays, cells, or blocks as defined by various manufacturers. SCM modules 370 or 380 may have a DIMM form factor that is compatible with DRAM DIMM sockets. Each SCM module may have a capacity of, for example, 512 GB, 1 TB, 2 TB, or more.

Figure 4:
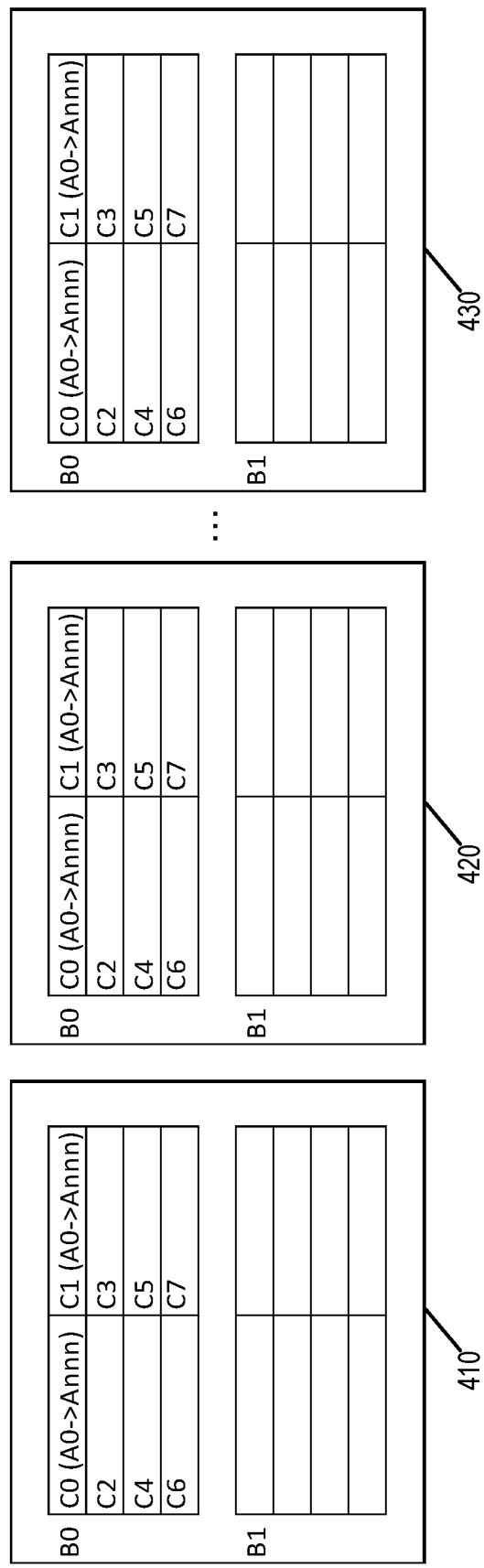
FIG. 4 illustrates multiple SCM chips in a computer system, according to some aspects of this disclosure.

FIG. 4 illustrates an example structure of an SCM module 400 including multiple SCM chips 410, 420, . . . , and 430 (or other structural units) in a computer system, according to some aspects of this disclosure. In the illustrative example shown in FIG. 4, each SCM chip may include two banks B0 and B1, and each bank may include 8 cells C0, C1, . . . , and C7 that can be written or read independently (i.e., individually addressable). Each cell may include, for example, millions or more of addressable units, such as pages or blocks, with addresses of A0 to Annn. Each bank may be programmed independently (i.e., individually programmable).

In many cases, after an SCM operation, such as an SCM read or write operation, a delay time may be needed before the SCM can perform another operation. For example, a delay time may be needed between two consecutive read operations on the same SCM bank. A delay time may be needed to switch to a different rank of SCM, where a rank may refer to an independent collection of banks, such as banks on a same chip. A delay time may also be needed between a read operation and a subsequent write operation on a same bank or cell, between a write operation and a subsequent read operation on a same bank or cell, between two consecutive write operations on a same cell, etc. The delay time may be different for each of the above scenarios. In general, the delay time needed for switching ranks may be shorter than the delay time needed between a read command and a subsequent write command, which may be shorter than the delay time between consecutive reads from the same bank.

To write data into an address in a cell of a bank in an SCM module, a memory controller, such as memory controller 352 or 362, may first write the data to the address in the cell of the bank, and then program the bank to persist the data. Thus, a write operation on the SCM may include writing the data to the SCM and persisting the data on the SCM. The data persisting operation may affect all cells in the bank, and is required before the data written can be read back. When the cell is written, it may not be written again before the data persisting operation is completed. However, the data persisting operation may not be needed before writing to or reading from a different cell in the same bank.

In general, a data persisting operation may take much longer time (e.g., more than 10× or longer) than a read or write operation. During the data persisting operation for an SCM bank in an SCM chip, the interface and the bus to the SCM chip could not be used to access any cell in the SCM bank for read or write operations. In addition, if the SCM channel performs the SCM transactions (e.g., read and write operations) sequentially, requests for transactions with other SCM banks, chips, or modules may not be serviced by the SCM channel before the persisting operation is completed. Thus, the long data persisting time may significantly impact the utilization of the available bandwidth or achievable throughput of the SCM modules and the memory interface of the memory subsystem if the sequence of the transactions with the SCM modules is not in an optimized order.

As used herein, a command time may refer to the time (e.g., represented by the number of clock cycles) during which a write or read command is on an SCM bus (e.g., SCM command bus) at the interface between an SCM memory controller and an SCM. A delay time may refer to the time (e.g., represented by the number of clock cycles) that the transaction controller would wait after it issues a command before it can issue the next command on the bus, in order to be in compliance with the SCM device command-to-command timing specification. A stall time may refer to the time (e.g., represented by the number of clock cycles) during which an SCM command is available to be executed but a SCM command-to-command timing specification has not been satisfied. An active time may refer to the time (e.g., represented by the number of clock cycles) during which the performance of the SCM is monitored.

The utilization rate of an SCM or an SCM bus (or interface) may refer to the percentage of the total command time during a measurement time period. The total command time may be determined based on the total number of read and write commands during the measurement time period and the time for each command (i.e., command time). Thus, the utilization rate may be represented by:

$$\text{Utilization rate} = \frac{(\text{read command count} + \text{write command count}) \times \text{command time}}{\text{Active time}} \times 100\%.$$

In one example, when there are always requests in the read/write request buffer waiting to be processed, the utilization rate (which may be referred to as utilization efficiency in such a circumstance) of an SCM or SCM bus during a measurement time period may be the percentage of the total command time with respect to the sum of the total command time and the total delay time between commands during the measurement time period.

For example, if eight (8) consecutive read commands are issued to a same bank, the utilization rate (i.e., utilization efficiency) may be determined by:

$$\text{Utilization rate} = \frac{8 \times \text{command time}}{8 \times \text{command time} + 7 \times (\text{read-to-read delay time})} \times 100\%.$$

In one example, if the read-to-read delay time for consecutive reads from the same bank is 10 clock cycles and the command time is 4 clock cycle, the utilization efficiency may be:

8×4/(8×4+7×10)×100%=31%.

In a second example, four (4) read commands may each be issued to a different bank on one rank, followed by four (4) read commands each issued to a different bank on another rank, where the command time is four (4) clock cycles and the rank switching delay is three (3) clock cycles. Because no time delay is needed between two read commands each to a different bank, the utilization rate (i.e., utilization efficiency) in the second example may be:

(4×4+4×4)/(4×4+4×4+3)×100%=91%.

Thus, the utilization rate (and the utilization efficiency) of an SCM may be increased by, for example, reducing the delays between the commands. In some implementations, the delays between the commands may be reduced by reordering the commands or operations because, as described above, the delay between two consecutive commands may be different for different combinations of the two consecutive commands. In some examples, the utilization rate may also refer to the utilization rate of the available bandwidth or throughput of the SCM bus.

Figures 5A, 5B:
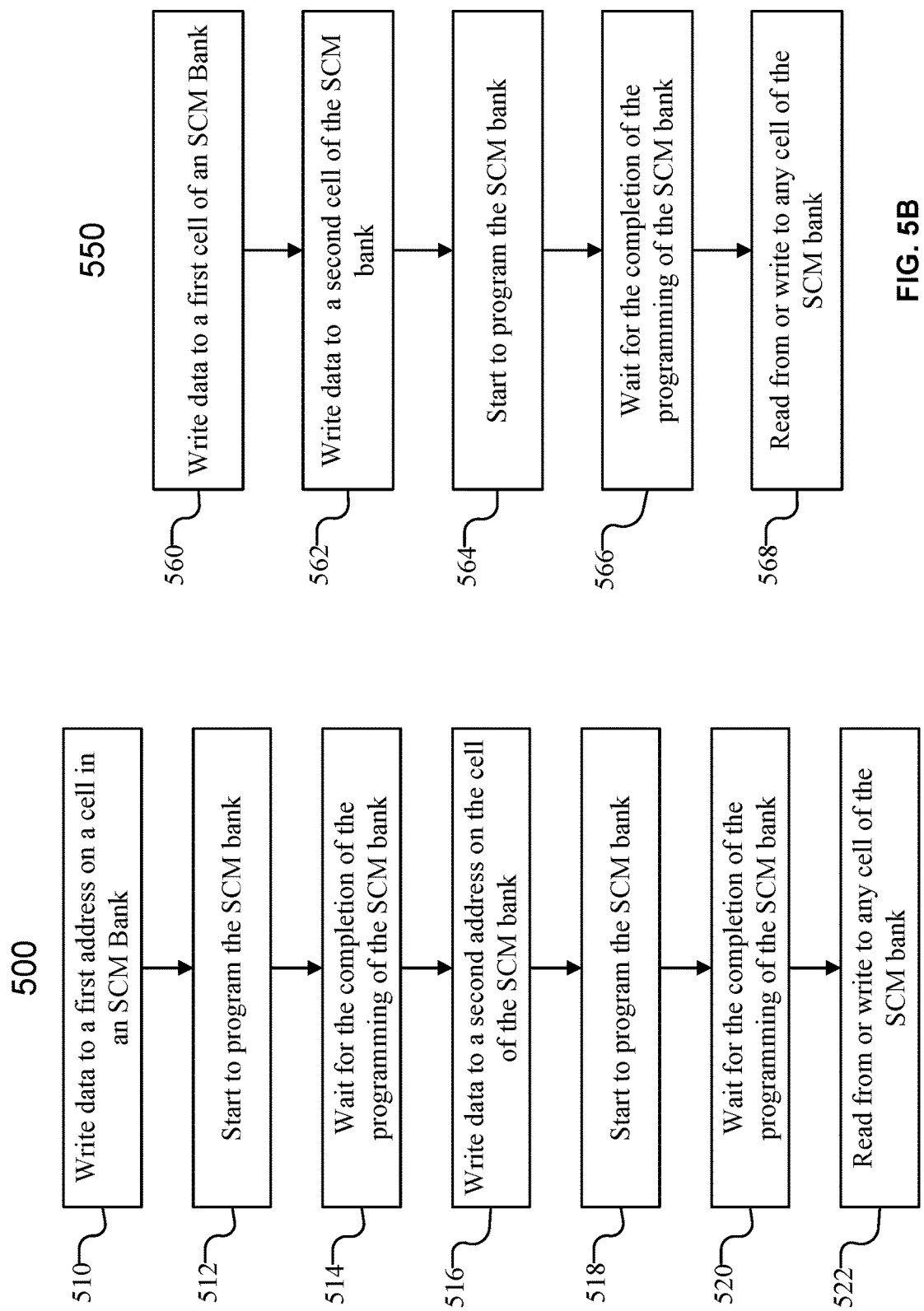
FIG. 5A illustrates an example sequence of SCM memory transactions, according to some aspects of this disclosure.
FIG. 5B illustrates an example sequence of SCM memory transactions, according to some aspects of this disclosure.

FIG. 5A illustrates an example sequence 500 of SCM memory transactions, according to some aspects of this disclosure. At block 510, a memory controller, such as memory controller 352 or 362, may write data to a first address on a cell (e.g., C0, C1, . . . , or C7 shown in FIG. 4) in an SCM bank (e.g., bank B0 or B1 shown in FIG. 4) of an SCM chip (e.g., SCM chip 410, 420, . . . , or 430 of FIG. 4). At block 512, the memory controller may start a data persisting operation to program the SCM bank (i.e., to persist the data). The data persisting operation may take a long period of time. During the data persisting operation, no other read or write to the bank can be performed. At block 514, the memory controller may wait for the data persisting operation (programming of the SCM bank) to finish before starting another SCM transaction. At block 516, after the completion of the programming of the SCM bank, the memory controller may start another write operation to a second address on the cell of the SCM bank. At block 518, the memory controller may start a data persisting operation to program the SCM bank (i.e., to persist the data). During the data persisting operation, no other read or write to the bank may be performed. At block 520, the memory controller may wait for the data persisting operation (i.e., programming of the SCM bank) to finish before starting another SCM transaction. At block 522, after the completion of the programming of the SCM bank, the memory controller may start another transaction (e.g., read or write) on a cell of the SCM bank. Thus, sequence 500 of SCM memory transactions, where a same cell of a same SCM bank is written multiple times (even if to different addresses), may result in a low utilization rate of the SCM bank because of the frequent data persisting operations and because no transaction can be performed on the SCM bank during the long data persisting time.

FIG. 5B illustrates an example sequence 550 of SCM memory transactions, according to some aspects of this disclosure. At block 560, a memory controller, such as memory controller 352 or 362, may write data to any address on a first cell (e.g., C0, C1, . . . , or C7 shown in FIG. 4) in an SCM bank (e.g., bank B0 or B1 shown in FIG. 4) of an SCM chip (e.g., SCM chip 410, 420, . . . , or 430 of FIG. 4). At block 562, the memory controller may write data to any address on a second cell of the SCM bank. At block 564, the memory controller may start a data persisting operation to program the SCM bank (i.e., to persist the data). The data persisting operation may take a long period of time. During the data persisting operation, no other read or write to the SCM bank may be performed. At block 566, the memory controller may wait for the data persisting operation (i.e., programming of the SCM bank) to finish before starting another SCM transaction. At block 568, after the completion of the programming of the SCM bank, the memory controller may start another transaction (e.g., read or write operation) on a cell of the SCM bank. Compared with sequence 500, sequence 550 includes the same number of (i.e., two) write transactions, but may be completed in about half of the time required to complete sequence 500. Thus, sequence 550 may result in a higher SCM utilization rate than sequence 500. In other words, sequence 550 may have a higher SCM transaction throughput (i.e., number of transactions in unit time) than sequence 500.

As shown by the example sequences in FIGS. 5A and 5B, the performance of an SCM module (e.g., utilization rate or throughput) may be significantly affected by the sequence of the transactions. Thus, the memory controller may be able to improve the performance of the SCM modules by optimizing the sequence of the transactions, for example, by reordering the sequence of the received requests to access the SCM module or changing the memory mapping to avoid writing to the same cell in a bank multiple times. The memory performance may also be improved by a software application that can request accesses to the SCM intelligently to optimize the sequence of SCM transactions.

In many implementations, it may be desirable to monitor the performance of the SCM modules, such as the number of stall cycles (the number of clock cycles at least one SCM transaction is waiting to be sent to an SCM device), the number of read accesses, the number of write accesses, the number of bytes read, and the number of bytes written, etc. For example, the measured performance of the SCM modules may be fed back to the memory controller to improve the performance of the SCM modules. The measured performance of the SCM modules may also be used to determine the effectiveness of the transaction reordering, memory remapping, and/or software application optimization.

According to certain aspects of the present disclosure, a circuit may be added to an SCM channel, such as SCM channel I (350) or SCM channel II (360), to monitor the performance of the SCM modules connected to the SCM channel. In some embodiments, a performance monitoring circuit may be included in the memory controller of an SCM channel (e.g., memory controller 352 or 362) to measure, for example, the number of stall cycles, the number of active cycles, the number of read accesses, and/or the number of write accesses.

Figure 6:
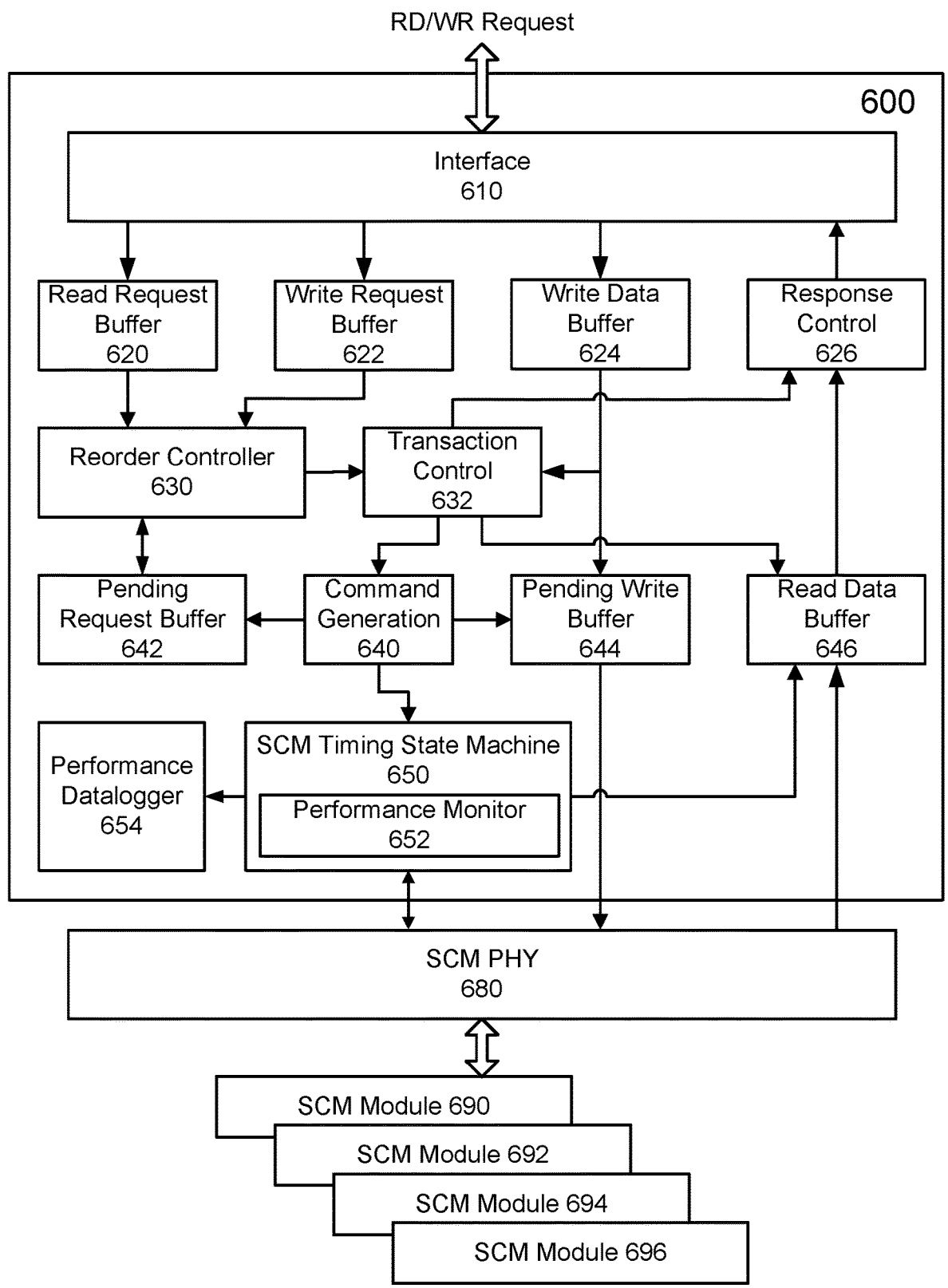
FIG. 6 is a simplified block diagram of an example SCM memory controller, according to some aspects of this disclosure.

FIG. 6 is a simplified block diagram of an example SCM memory controller 600, according to some aspects of this disclosure. Memory controller 600 may be an example implementation of memory controller 352 or 362 shown in FIG. 3. In some embodiments, memory controller 600 may receive read and write requests, reorder the requests, generate commands to the SCM module(s) to service the requests, control the timing of the signal interface to the SCM module(s), and monitor the performance of the SCM module(s). In some embodiments, memory controller 600 may also perform other functions, such as data encryption and/or decryption, ECC generation and correction, statistics generation, failed write management support, or memory block migration.

Memory controller 600 may include an interface 610 that interfaces between the interconnect fabric (e.g., interconnect fabric 340) and SCM modules 690, 692, 694, and 696. Interface 610 may receive read or write requests from the host processor through the interconnect fabric. In some embodiments, interface 610 may be based on, for example, an Advanced Extensible Interface (AXI) protocol. The access request to the SCM module(s) may be in the form of an AXI read request or an AXI write request. The read or write request may include the associated address. A write request may also be accompanied by the corresponding data. Interface 610 may grant to the request the access to a read request buffer 620, a write request buffer 622, and/or a write data buffer 624.

Read request buffer 620, write request buffer 622, and write data buffer 624 may each include a plurality of entries. Read request buffer 620 or write request buffer 622 may hold each read or write request as an entry in the buffer until the request is processed and dispatched by a transaction order control circuit, such as a reorder controller 630. Each entry in read request buffer 620 or write request buffer 622 may include a unique transaction identification. In some embodiments, read request buffer 620 and write request buffer 622 may be implemented as first in, first out buffers (FIFOs). Each entry in write data buffer 624 may include data associated with a write request. In some embodiments, write data buffer 624 may be implemented as a two-port RAM, such as a FIFO.

Reorder controller 630 may analyze all read and write requests from various blocks in memory controller 600 and grant the requests in an order that may maximize the utilization rate of the SCM module(s). For example, reorder controller 630 may compare the addresses of incoming requests from the request buffers to the addresses of requests that have been sent to SCM module(s) but have not yet been completed to determine which incoming read/write request can be serviced next. Reorder controller 630 may send a transaction request to a transaction control circuit 632 to initiate the creation of an SCM command for the incoming read/write request that is determined to be serviced next. The transaction request may indicate whether the request is a read or write request, and may provide the indices needed to locate the read/write request in an entry in the buffers. For example, for a read request, an index to read request buffer 620 may be provided to transaction control circuit 632. For a write request, the indices to write request buffer 622 and write data buffer 624 may be provided.

Transaction control circuit 632 may read the corresponding entries from the buffers and move transaction information (e.g., read or write, address, control, etc.) from the buffers to other circuits in memory controller 600. For example, transaction control circuit 632 may send the transaction information for the read/write request to a command generation circuit 640 for converting the request to an SCM command. In some embodiments, transaction control circuit 632 may send the transaction information to an address translation circuit (not shown in FIG. 6) for address translation, for example, for page migration, failed write management, or wear leveling.

Command generation circuit 640 may generate corresponding SCM command(s) for the request, and send the SCM command(s) to the SCM modules through an SCM timing state machine 650. The quests for which the corresponding SCM commands have been sent to the SCM module(s) but have not yet been completed may be stored in a pending request buffer 642. Command generation circuit 640 may also request the next data that is to be written to the SCM module(s) to be stored in a pending write buffer 644, which may hold the data to be written to the SCM module(s) until a completion status of the write is returned from the SCM module(s).

SCM timing state machine 650 may convert the commands received from command generation circuit 640 into the signaling needed by the SCM module(s), and ensure that timing specifications at the SCM memory interface are met. In some embodiments, SCM timing state machine 650 may operate at the same clock frequency as the SCM modules and may be asynchronous to the clock used by other circuits of memory controller 600. SCM timing state machine 650 may send the SCM commands with appropriate timing and level information to an SCM physical layer (PHY) 680, which may then drive the SCM bus(es) to SCM module 690, 692, 694, or 696 with command signals having appropriate data, timings, and levels. In some embodiments, SCM PHY 680 may include an SCM transmit PHY and an SCM receive PHY. In some implementations, SCM PHY 680 may be a part of memory controller 600.

Memory controller 600 may also include a read data buffer 646 and a response control circuit 626. Read data buffer 646 may be implemented as a two-port RAM, such as a FIFO. Read data buffer 646 may receive read data from the SCM modules through SCM PHY 680 (e.g., an SCM receive PHY). In some implementations, the read data may be decrypted and/or error-corrected before it is stored in read data buffer 646. The output of read data buffer 646 may be communicatively coupled to response control circuit 626. Response control circuit 626 may read the entry at the top of read data buffer 646 and return an acknowledgement to read data buffer 646, which may cause the read pointer of read data buffer 646 to increment.

In some embodiments, a performance monitoring circuit 652 may be included in SCM timing state machine 650 or other part of memory controller 600. Performance monitoring circuit 652 may monitor the utilization rate of the SCM modules. For example, performance monitoring circuit 652 may count the number of reads, writes, active cycles, and stall cycles at the memory interface, and determine a utilization rate for the SCM modules. In some embodiments, performance monitoring circuit 652 may be enabled to operate for an indefinite time period. In some embodiments, a timer can be programmed so that performance monitoring circuit 652 may only operate for a specified number of clock cycles. In some embodiments, performance monitoring circuit 652 may be dynamically configured to either operate until it is disabled or to operate for a specified amount of time. In some embodiments, the performance information measured by performance monitoring circuit 652 may be stored in a performance datalogger 654, which may include, for example, a memory, a buffer, or a FIFO. The measured performance information may be used, for example, by the reorder controller to adjust the reordering if necessary, or by transaction control circuit 632 to send address translation instructions for address remapping before sending the request and address to command generation circuit 640. The measured performance information may also be used to optimize the memory access request pattern of a software application. In some implementations, the measured performance information may be read from performance datalogger 654, for example, by some control and status registers (CSRs).

Figure 7:
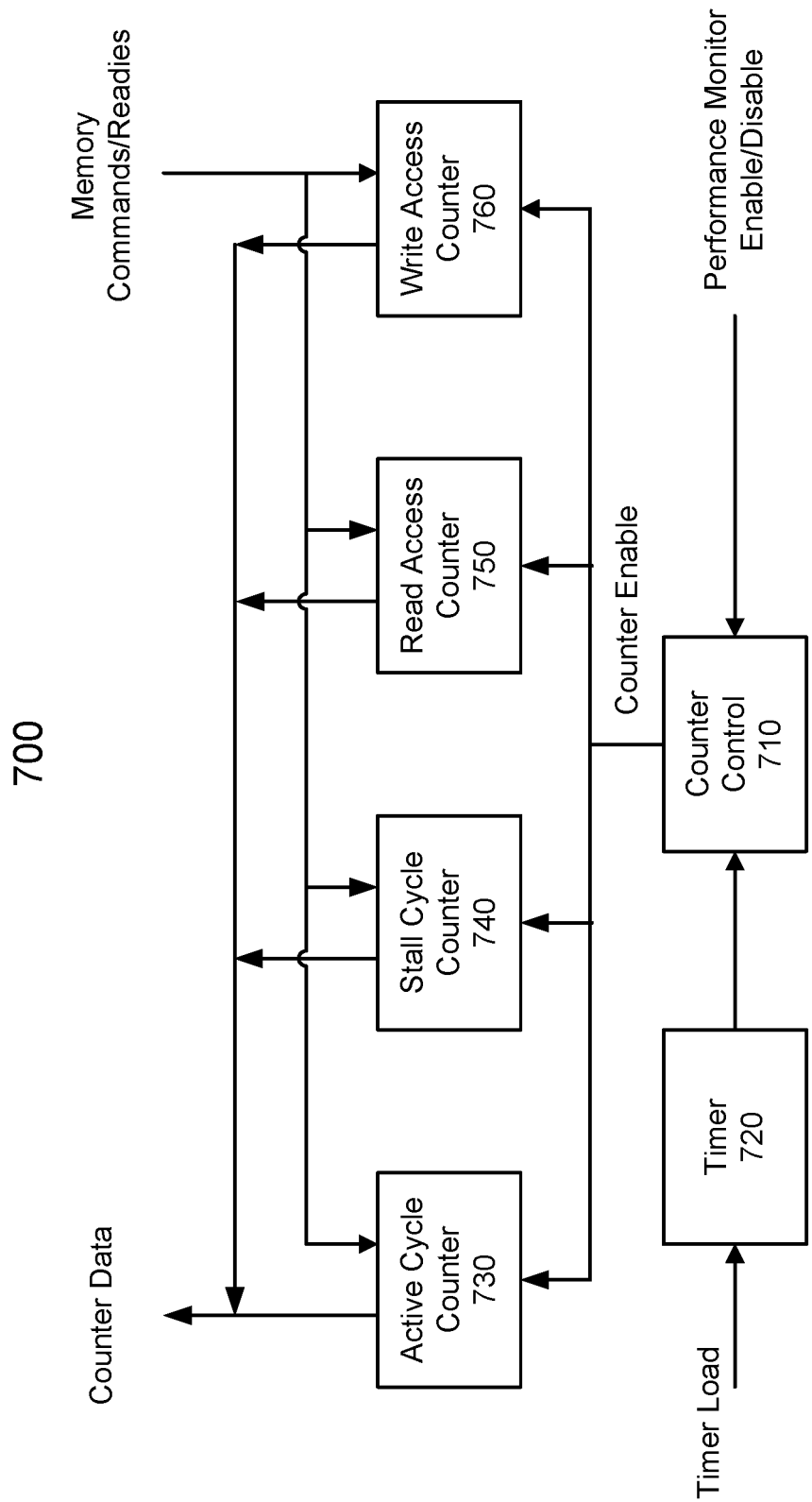
FIG. 7 is a simplified block diagram of an example performance monitoring circuit, according to some aspects of the present disclosure.

FIG. 7 is a simplified block diagram of an example performance monitoring circuit 700, according to some aspects of the present disclosure. Performance monitoring circuit 700 may be an example implementation of performance monitoring circuit 652. Performance monitoring circuit 700 may be configured to measure one or more metrics including, for example, an active cycle count (in SCM clock cycle), a stall cycle count (in SCM clock cycle), a read access count, and a write access count.

Performance monitoring circuit 700 may include a plurality of counters, such as, for example, an active cycle counter 730, a stall cycle counter 740, a read access counter 750, and a write access counter 760. Active cycle counter 730 or stall cycle counter 740 may be implemented using a clock counter. The counters may be coupled to, for example, the interface between command generation circuit 640 and SCM timing state machine 650, or the interface between SCM PHY 680 and SCM timing state machine 650. In some implementations, some counters may be coupled to pending request buffer 642. Thus, the counters may be able to monitor commands and/or ready signals issued by command generation circuit 640 to SCM timing state machine 650, SCM commands issued from SCM timing state machine 650 to SCM PHY 680, or commands that have been sent to the SCM module(s) but have not been completed. Based on the actual commands that have been sent to the low-level control for SCM (e.g., SCM timing state machine 650 or SCM PHY 680), the counters may count, for example, the number of read accesses (e.g., by read access counter 750) during an active time period of the counters (e.g., counted by active cycle counter 730), the number of write accesses (e.g., by write access counter 760) during the active time period, the total number of SCM clock cycles during which no command is on the SCM bus even though there are requests in the request buffer (e.g., by stall cycle counter 740) during the active time period, the number of SCM clock cycles a request has to wait in the request buffer before a command for the request is issued, the number of SCM clock cycles it takes for a command to be completed, the number of bytes read, and the number of bytes written, etc.

As described above, performance monitoring circuit 700 can be configured to operate for an indefinite period or only for a specified number of clock cycles (e.g., using a programmable timer). For example, performance monitoring circuit 700 may be able to operate in two modes. In the first mode, performance monitoring circuit 700 may be enabled or disabled using a control and status register (CSR). In the second mode, performance monitoring circuit 700 may be enabled or disabled using a programmable timer 720. Performance monitoring circuit 700 may include a counter control circuit 710, which may be controlled by timer 720 or the CSR to handle the enabling/disabling of various performance counters.

In some embodiments, in the first mode, the counters may be enabled by counter control circuit 710 when, for example, a "1" is written to a Counter Enable bit in a performance monitor control CSR. Writing a "1" to the Counter Enable bit may cause counter control circuit 710 to enable all counters. The counters may remain enabled until a "0" is written to the Counter Disable bit in the performance monitor control CSR, which may disable the counters and trigger the counter values to be sent, for example, to performance datalogger 654. In some embodiments, each counter may be controlled independently by counter control circuit 710. For example, each individual counter may correspond to a different bit in a performance monitor control CSR, and may be enabled or disabled by counter control circuit 710 when the corresponding bit is asserted or de-asserted.

In some embodiments, in the second mode, a cycle count value may be loaded into timer 720. A CSR bit may be used to enable timer 720 and counter control circuit 710 to enable one or more counters. Once enabled, the enabled counter(s) may continue to count, and timer 720 may decrement by one in each SCM clock cycle until it reaches zero (i.e., expires). When timer 720 expires, counter control circuit 710 may disable the counter(s), and trigger the counter value(s) to be sent to be sent, for example, to performance datalogger 654. In some implementations, the counters may be reset after the values in the counters are saved.

As described above, the saved counter values may be used to determine the performance of the SCM modules, such as the utilization rate of the SCM modules. Based on the determined performance of the SCM modules, the memory controller may improve the performance of the SCM modules and thus SCM memory subsystem by reordering future memory transactions or changing the memory mapping. The determined performance may also be used by a software application to improve the performance of the SCM memory subsystem (e.g., reducing the latency or turn-around time of the requests from the software application) by changing the sequence of memory access requests.

Figure 8:
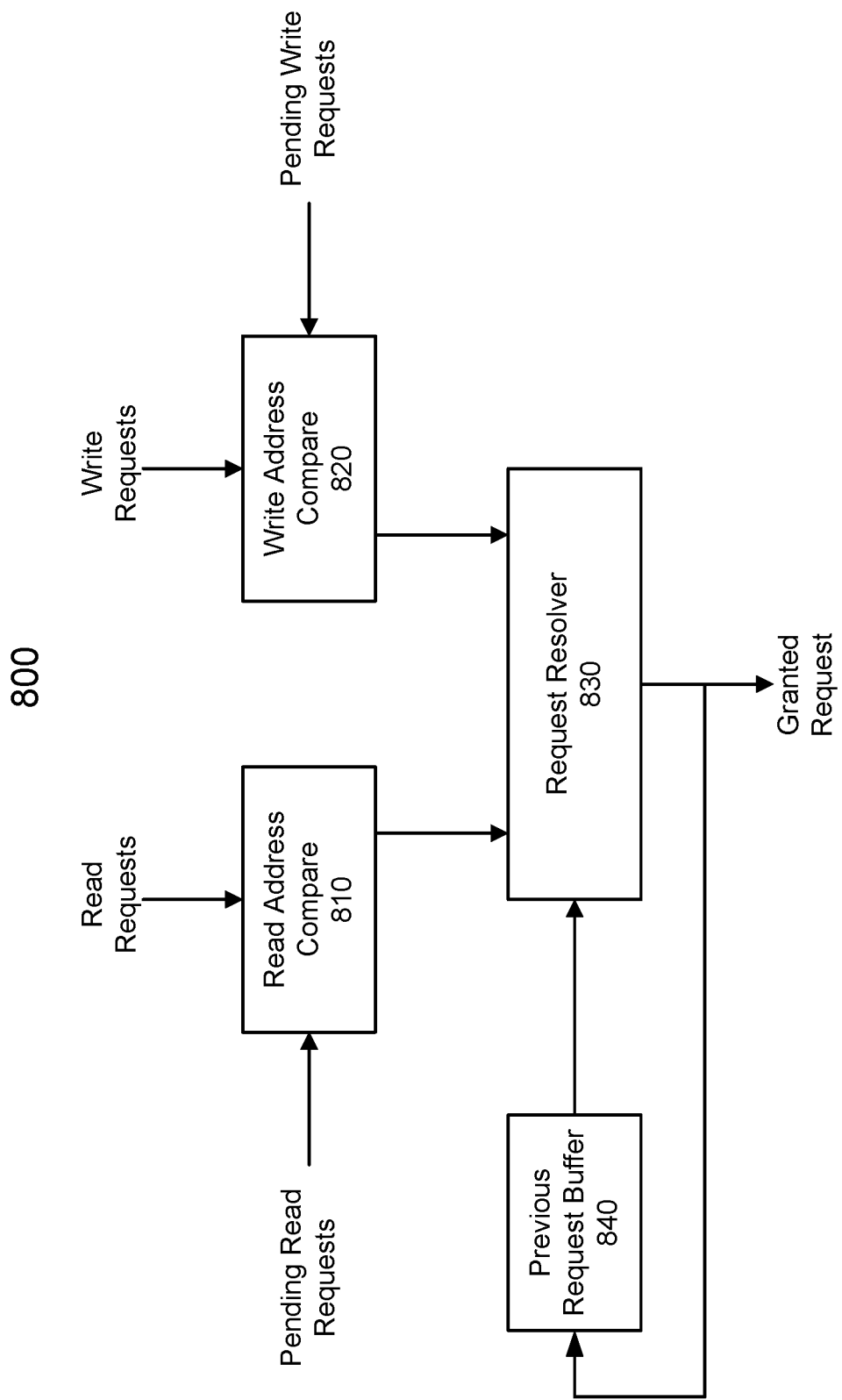
FIG. 8 is a simplified block diagram of an example memory request reordering circuit, according to some aspects of the present disclosure.

FIG. 8 is a simplified block diagram of an example memory request reordering circuit 800 (e.g., reorder controller 630), according to some aspects of the present disclosure. Memory request reordering circuit 800 may analyze memory requests from various blocks in a memory controller (e.g., memory controller 352, 362, or 600) and grant the requests in an order that may maximize the SCM utilization. In the example shown in FIG. 8, memory request reordering circuit 800 may include a read address compare circuit 810, a write address compare circuit 820, a request resolver 830, and a previous request buffer 840.

Read address compare circuit 810 and write address compare circuit 820 may receive incoming read or write requests from other circuits in the memory controller, and compare the addresses (e.g., bank/cell addresses) of the incoming requests to the addresses (e.g., bank/cell addresses) of pending requests (e.g., stored in pending request buffer 642) to determine the incoming requests that can be serviced next from these incoming requests. For example, read address compare circuit 810 and write address compare circuit 820 may compare the address (e.g., bank/cell address) of each incoming request to the addresses (e.g., bank/cell addresses) of all pending requests to determine if the address of the incoming request matched any pending request's address. If there is a match, the incoming request is masked because the new request could not be serviced by the SCM modules at that time. The remaining incoming requests may be sent to request resolver 830 as qualified requests.

Request resolver 830 may select a request to grant from the qualified requests based on a predetermined priority and information about previous requests stored in previous request buffer 840, in order to select a qualified request that will best utilize the bandwidth of the SCM modules coupled to the memory controller. For example, request resolver 830 may have multiple stages, where each stage may correspond to one condition set in the predetermined priority and the stages may be arranged based on the predetermined priority. In one example, high priority refresh write and read requests (e.g., indicated by a high priority enable signal associated with the request) may have the highest priority, followed by request buffer read/write requests and scrubber write and read requests. Normal priority refresh write and read requests may have the lowest priority. The qualified requests may flow through the multiple stages of request resolver 830, and may be masked until only one request remains at the end of the stages. The remaining request may be granted by request resolver 830. When a request is granted by request resolver 830, the relevant fields of the granted request may be stored in previous request buffer 840, which may be used by request resolver 830 to determine the next request to grant as described above. In one example, the relevant fields of a granted request that are stored in previous request buffer 840 may include a bit indicating whether the data in the buffer is valid, a bit indicating whether the request is a read or write request, and address bits indicating the address of the target SCM rank, where an SCM rank may refer to a collection of SCM banks.

FIG. 9A illustrates an example reordered sequence 900 of SCM memory transactions, according to some aspects of the present disclosure. As described above, sequence 900 of SCM memory transactions may be reordered, for example, by reorder controller 630 (e.g., memory request reordering circuit 800 of FIG. 8) and/or the memory controller (to remapping the address of the requests), or by a software application when sending the requests, based on the performance (e.g., bandwidth utilization) of the SCM modules measured by performance monitoring circuit 652 of FIG. 6 (e.g., performance monitoring circuit 700). Before the reordering, the received requests may include, for example, writing data to a first cell in a first SCM bank followed by programming the first SCM bank, writing data to a second cell in the first SCM bank followed by programming the first SCM bank, writing data to a third cell in the first SCM bank followed by programming the first SCM bank, writing data to a first cell in a second SCM bank followed by programming the second SCM bank, writing data to a second cell in the second SCM bank followed by programming the second SCM bank, and then writing data to a third cell in the second SCM bank followed by programming the second SCM bank. As described above, programming a SCM bank may take a long time period. Therefore, performing the requests according to the sequence described above may significantly reduce the utilization rate of the SCM modules.

In the reordered sequence 900 of SCM memory transactions, a first set of data may be written to a first cell in a first bank of an SCM chip (or module) in a first write operation 902 to service a first write request. A second set of data may be written to a second cell in the first bank of the SCM chip in a second write operation 904 to service a second write request. A third set of data may be written to a third cell in the first bank of the SCM chip in a third write operation 906 to service a third write request. A fourth set of data may be written to a first cell in a second bank of the SCM chip in a fourth write operation 908 to service a fourth write request. A fifth set of data may be written to a second cell in the second bank of the SCM chip in a fifth write operation 910 to service a fifth write request. A sixth set of data may be written to a third cell in the second bank of the SCM chip in a sixth write operation 912 to service a sixth write request. The first bank of the SCM chip may then be programmed in a first programming operation 914 to persist the data written into the first, second, and third cells in the first bank. After first programming operation 914 starts but before it completes, the second bank of the SCM chip may be programmed in a second programming operation 916 to persist the data written into the first, second, and third cells in the second bank.

In this way, a bank of the SCM chip may not need to be programmed to persist the data written to a cell of the bank each time the data is written to the bank. The bank may only be programmed after data has been written to multiple cells of the bank. Thus, the number of programming operations may be significantly reduced. Furthermore, during the programming of any bank of an SCM chip (module), data can be written to any bank of a different SCM chip and be persisted by programming the bank. As a result, data may still be written to the SCM modules serviced by a memory controller when one or more banks of one or more SCM modules serviced by the memory controller are being programmed for data persisting. Therefore, the bandwidths of the SCM modules and the buses between the memory controller and the SCM modules can be better utilized.

FIG. 9B illustrates an example reordered sequence 950 of SCM memory transactions, according to some aspects of the present disclosure. As described above, sequence 950 of SCM memory transactions may be reordered, for example, reorder controller 630 (e.g., memory request reordering circuit 800 of FIG. 8) and/or the memory controller (to remapping the address of the requests), or by a software application when sending the requests, based on the performance (e.g., the utilization rate) of the SCM modules measured by performance monitoring circuit 652 of FIG. 6. In the reordered sequence 950 of SCM memory transactions, a first set of data may be written to a first cell in a first bank of an SCM chip (or module) in a first write operation 952 to service a first write request. A second set of data may be written to a second cell in the first bank of the SCM chip in a second write operation 954 to service a second write request. A third set of data may be written to a third cell in the first bank of the SCM chip in a third write operation 956 to service a third write request. The first bank of the SCM chip can then be programmed in a first programming operation 958 to persist the data written into the first, second, and third cells in the first bank.

After first programming operation 958 starts but before it completes, a fourth set of data may be written to a first cell in a second bank of the SCM chip in a fourth write operation 960 to service a fourth write request. A fifth set of data may be written to a second cell in the second bank of the SCM chip in a fifth write operation 962 to service a fifth write request. A sixth set of data may be written to a third cell in the second bank of the SCM chip in a sixth write operation 964 to service a sixth write request. The second bank of the SCM chip may then be programmed in a second programming operation 966 to persist the data written into the first, second, and third cells in the second bank.

In this way, a bank of the SCM chip may not need to be programmed to persist the data written to a cell of the bank each time the data is written to the bank. The bank may only be programmed after data has been written to multiple cells of the bank. Thus, the number of programming operations may be significantly reduced. Furthermore, during the programming of one bank, data can be written to a second bank of the SCM chip and be persisted by programming the second bank. Similarly, during the programming of the second bank, data can be written to a third bank of the SCM chip and be persisted by programming the third bank. In addition, during the programming of any bank of a first SCM chip (module), data can be written to any bank of a different SCM chip and be persisted by programming the bank. As a result, data may be written to the SCM modules serviced by a memory controller when one or more banks of one or more modules serviced by the same memory controller are being programmed for data persisting. Therefore, the bandwidths of the SCM modules and the buses between the memory controller and the SCM modules can be better utilized.

Figure 10:
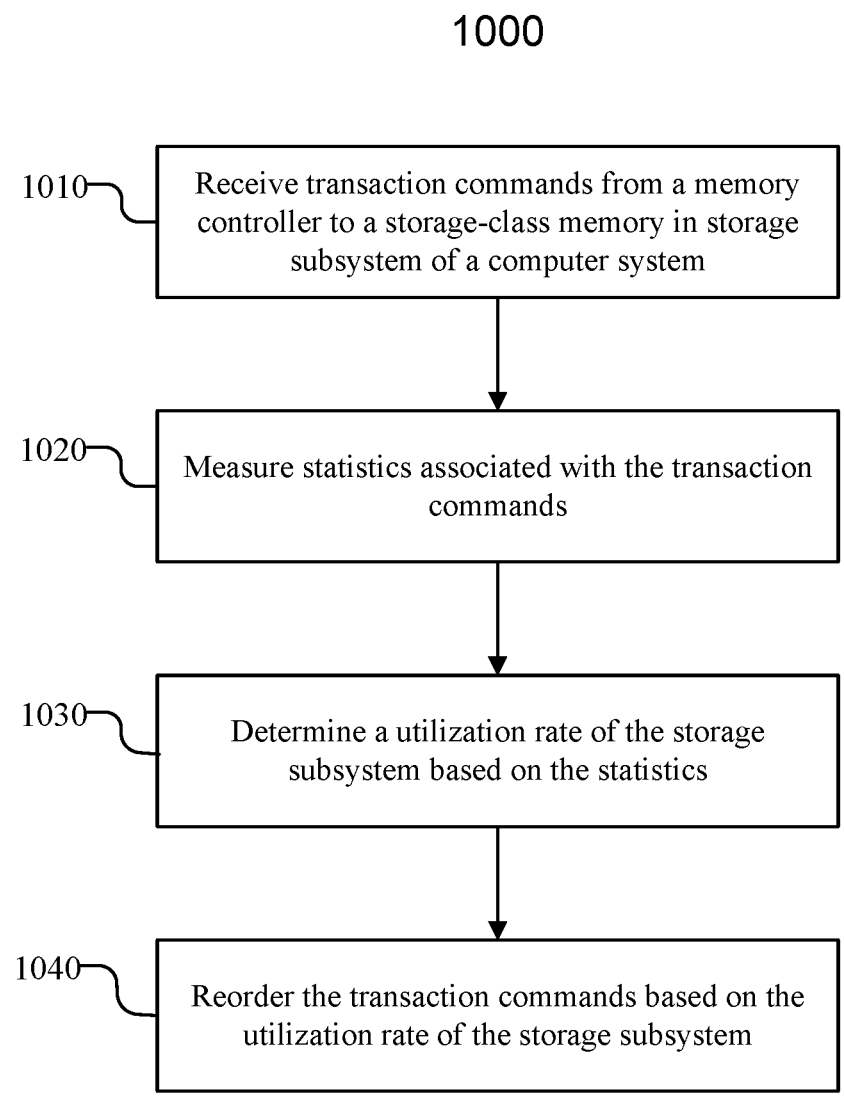
FIG. 10 is a flow chart illustrating an example method for storage-class memory performance measurement, according to some aspects of the present disclosure.

FIG. 10 is a flow chart illustrating an example method 1000 for storage-class memory performance measurement, according to some aspects of the present disclosure. Method 1000 may be performed by, for example, SCM interface 210, memory controller 352 or 362, memory controller 600, performance monitoring circuit 652, etc.

At block 1010, a memory controller, more specifically, a performance monitoring circuit at an interface between the memory controller and a storage-class memory in a memory subsystem of a computer system, may receive transaction commands from the memory controller to the storage-class memory. Each transaction command may correspond to an operation on the storage-class memory, such as a read or write operation. In some embodiments, the performance monitoring circuit may include one or more counters. In some embodiments, the performance monitoring circuit may be enabled or disabled using control register(s) or timer(s). In some embodiments, the transaction commands may be the commands that are sent to the storage-class memory via an SCM PHY. In some embodiments, the transaction commands may be the commands that are issued by a command generation circuit, such as command generation circuit 640, to a timing control circuit, such as SCM timing state machine 650.

At block 1020, the performance monitoring circuit may measure one or more statistics associated with the transaction commands during an active time period of the performance monitoring circuit using, for example, the one or more counters. Some examples of the statistics may include the active time period (i.e., a measuring time period or a performance monitoring time period), an accumulated stall time period in the active time period during which a corresponding transaction command for at least one transaction request received by the memory controller has not been sent to the storage-class memory even though there is no command on the SCM bus (e.g., an SCM command bus) at the interface between the memory controller and the storage-class memory, a total number of read operations ($N_{read}$) performed by the storage-class memory during the active time period, a total number of write operations ($N_{write}$) performed by the storage-class memory during the active time period, a total number of bytes of data written into the storage-class memory during the active time period, and a total number of bytes of data read from the storage-class memory during the active time period.

At block 1030, the memory controller or some other processing circuit may determine a utilization rate of the memory subsystem based on the statistics. The utilization rate may include, for example, the percentage of time during which there are commands on the bus(es) at the interface between the memory controller and the storage-class memory in a measuring time period, the percentage of the stall time period during a measuring time period, a data transfer (read or write) rate (i.e., throughput) during a measuring time period, the number of operations (commands) performed on the storage-class memory in a time period, the bandwidth utilization rate (e.g., as a fraction of the maximum achievable bandwidth) of the bus(es) or interface between the memory controller and the storage-class memory, etc. In one example, the utilization rate of the SCM may be determined by:

(total command time)/(active time period)×100%, or (total read command time+total write command time)/(active time period)×100%.

In another example, the utilization efficiency of the SCM may be determined by:

(active time period−stall time period)/(active time period)×100%, or $$\frac{(N_{read} + N_{write}) \times \text{command time}}{(N_{read} + N_{write}) \times \text{command time} + \text{stall time period}} \times 100\%.$$

At block 1040, after the utilization rate is determined, the memory controller or other hardware/software may reorder subsequently received transaction requests based on the determined utilization rate of the memory subsystem. For example, the received transaction requests may be reordered such that two or more read or write transactions on different cells of a bank of the storage-class memory may be performed before the bank of the storage-class memory is programmed to persist data written to the bank. In some embodiments, the received transaction requests may be reordered such that a first bank of the storage-class memory may be programmed to persist data written to the first bank, and a read or write transaction on a second bank of the storage-class memory may be performed before the programming of the first bank of the storage-class memory completes. In some embodiments, two or more read or write transactions on different cells of a first bank of the storage-class memory may be performed, followed by two or more read or write transactions on different cells of a second bank of the storage-class memory. The first bank of the storage-class memory may then be programmed to persist data written to the cells of the first bank, and, before the programming of the first bank of the storage-class memory completes, the second bank of the storage-class memory may be programmed to persist data written to the cells of the second bank. In some embodiments, transaction requests received after the utilization rate is determined may be mapped to different SCM banks or SCM channels of the memory subsystem of the computer system based on the determined utilization rate of the memory subsystem. In some embodiments, a software application may read the measured statistics or the determined utilization rate of the memory subsystem, and determine the order of the transaction requests to be sent to the memory subsystem based on the measured statistics or the determined utilization rate of the memory sub system.

Figure 11:
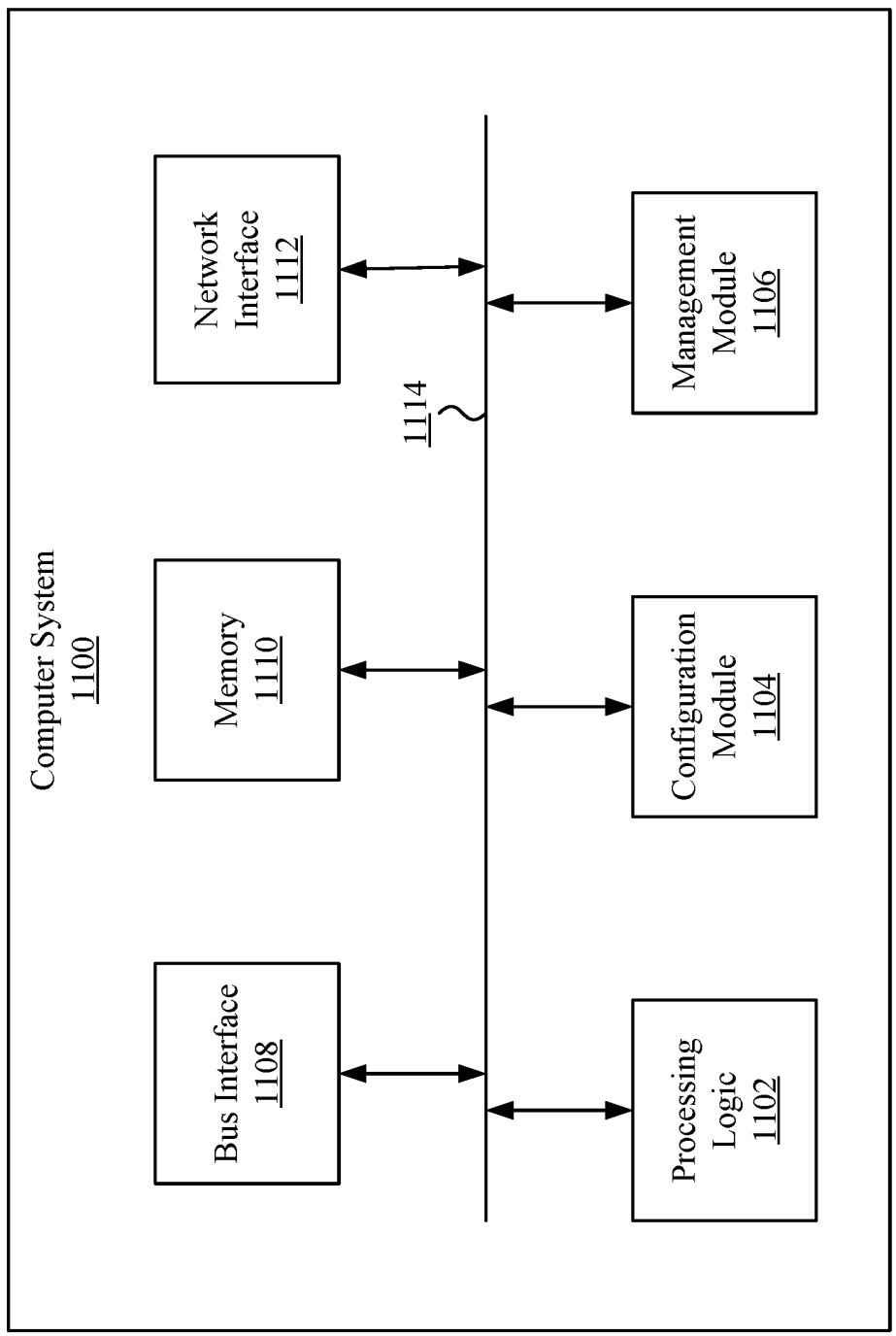
FIG. 11 illustrates an example of a computer system, according to certain aspects of the present disclosure.

FIG. 11 illustrates an example of a computer system 1100. Functionality and/or several components of the computer system 1100 may be used without limitation with other embodiments disclosed elsewhere in this disclosure, without limitations. A computer system 1100 may facilitate processing of packets and/or forwarding of packets from the computer system 1100 to another device. As referred to herein, a "packet" or "network packet" may refer to a variable or fixed unit of data. In some instances, a packet may include a packet header and a packet payload. The packet header may include information associated with the packet, such as the source, destination, quality of service parameters, length, protocol, routing labels, error correction information, etc. In certain implementations, one packet header may indicate information associated with a series of packets, such as a burst transaction. In some implementations, the computer system 1100 may be the recipient and/or generator of packets. In some implementations, the computer system 1100 may modify the contents of the packet before forwarding the packet to another device. The computer system 1100 may be a peripheral device coupled to another computer device, a switch, a router or any other suitable device enabled for receiving and forwarding packets.

In one example, the computer system 1100 may include processing logic 1102, a configuration module 1104, a management module 1106, a bus interface module 1108, memory 1110, and a network interface module 1112. These modules may be hardware modules, software modules, or a combination of hardware and software. In certain instances, modules may be interchangeably used with components or engines, without deviating from the scope of the disclosure. The computer system 1100 may include additional modules, not illustrated here, such as components discussed with respect to the nodes disclosed in FIG. 12. In some implementations, the computer system 1100 may include fewer modules. In some implementations, one or more of the modules may be combined into one module. One or more of the modules may be in communication with each other over a communication channel 1114. The communication channel 1114 may include one or more busses, meshes, matrices, fabrics, a combination of these communication channels, or some other suitable communication channel.

The processing logic 1102 may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in the processing logic 1102 may include processors developed by ARM®, MIPS®, AMD®, Intel®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 1102 may be stored on a computer-readable storage medium, for example, in the form of a computer program. The computer-readable storage medium may be non-transitory. In some cases, the computer-readable medium may be part of the memory 1110.

The memory 1110 may include either volatile or non-volatile, or both volatile and non-volatile types of memory. The memory 1110 may, for example, include random access memory (RAM), read only memory (ROM), Electrically Erasable Programmable Read-Only Memory (EEPROM), flash memory, and/or some other suitable storage media. In some cases, some or all of the memory 1110 may be internal to the computer system 1100, while in other cases some or all of the memory may be external to the computer system 1100. The memory 1110 may store an operating system comprising executable instructions that, when executed by the processing logic 1102, provides the execution environment for executing instructions providing networking functionality for the computer system 1100. The memory may also store and maintain several data structures and routing tables for facilitating the functionality of the computer system 1100.

In some implementations, the configuration module 1104 may include one or more configuration registers. Configuration registers may control the operations of the computer system 1100. In some implementations, one or more bits in the configuration register can represent certain capabilities of the computer system 1100. Configuration registers may be programmed by instructions executing in the processing logic 1102, and/or by an external entity, such as a host device, an operating system executing on a host device, and/or a remote device. The configuration module 1104 may further include hardware and/or software that control the operations of the computer system 1100.

In some implementations, the management module 1106 may be configured to manage different components of the computer system 1100. In some cases, the management module 1106 may configure one or more bits in one or more configuration registers at power up, to enable or disable certain capabilities of the computer system 1100. In certain implementations, the management module 1106 may use processing resources from the processing logic 1102. In other implementations, the management module 1106 may have processing logic similar to the processing logic 1102, but segmented away or implemented on a different power plane than the processing logic 1102.

The bus interface module 1108 may enable communication with external entities, such as a host device and/or other components in a computing system, over an external communication medium. The bus interface module 1108 may include a physical interface for connecting to a cable, socket, port, or other connection to the external communication medium. The bus interface module 1108 may further include hardware and/or software to manage incoming and outgoing transactions. The bus interface module 1108 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 1108 may include the physical layer for any of these bus protocols, including a connector, power management, and error handling, among other things. In some implementations, the computer system 1100 may include multiple bus interface modules for communicating with multiple external entities. These multiple bus interface modules may implement the same local bus protocol, different local bus protocols, or a combination of the same and different bus protocols.

The network interface module 1112 may include hardware and/or software for communicating with a network. This network interface module 1112 may, for example, include physical connectors or physical ports for wired connection to a network, and/or antennas for wireless communication to a network. The network interface module 1112 may further include hardware and/or software configured to implement a network protocol stack. The network interface module 1112 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the computer system 1100 may include multiple network interface modules, each configured to communicate with a different network. For example, in these implementations, the computer system 1100 may include a network interface module for communicating with a wired Ethernet network, a wireless 802.11 network, a cellular network, an Infiniband network, etc.

The various components and modules of the computer system 1100, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc. In some embodiments of the technology, the SoC or other component may include multiple subsystems as disclosed with respect to FIG. 12.

Figure 12:
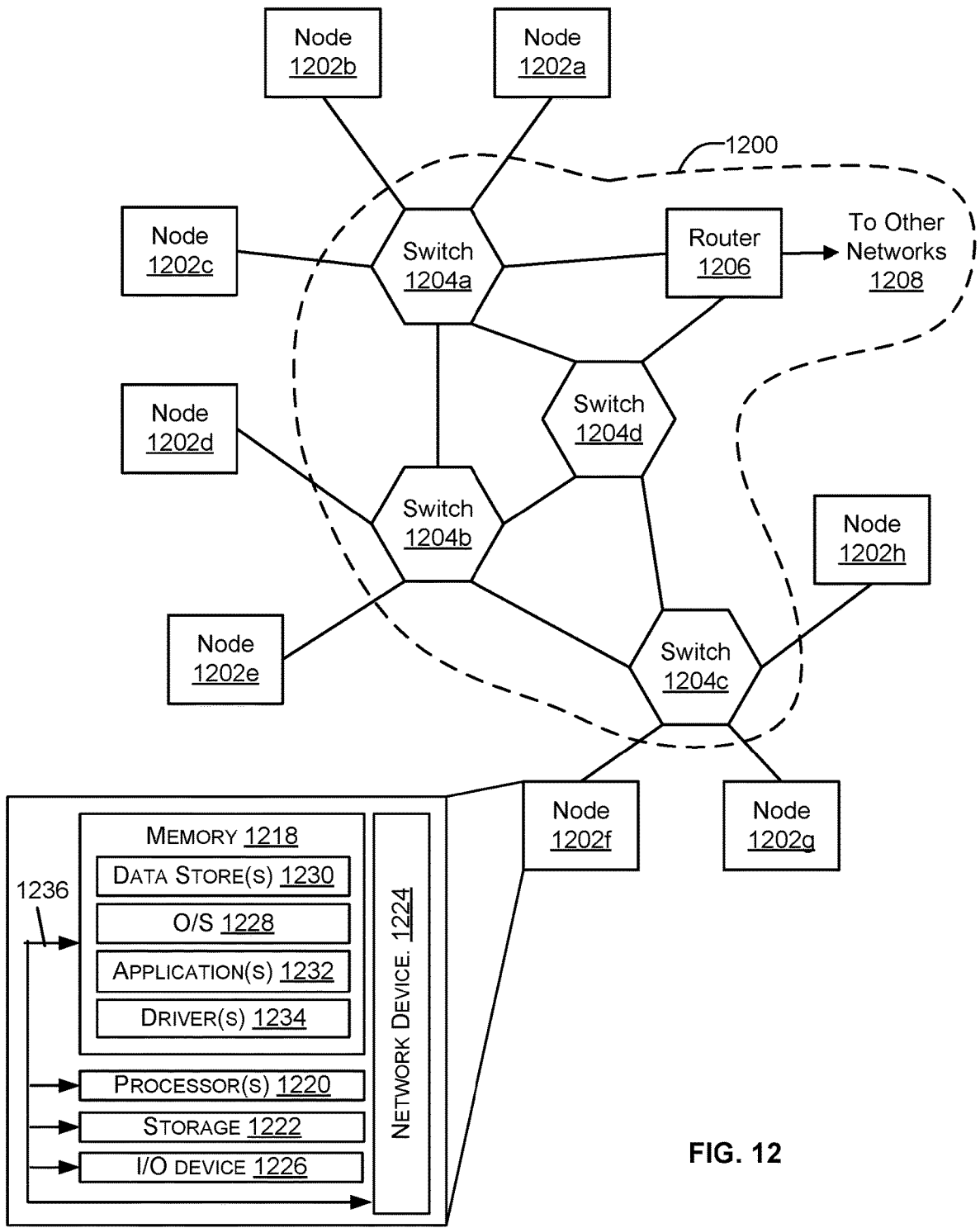
FIG. 12 illustrates an example architecture for features and systems described herein that includes one or more service provider computers and/or a user device connected via one or more networks, according to certain aspects of the present disclosure.

FIG. 12 illustrates a network 1200, illustrating various different types of computer systems 1100 of FIG. 11, such as nodes comprising servers, network device, switches and routers. In certain embodiments, the network 1200 may be based on a switched architecture with point-to-point links. As illustrated in FIG. 12, the network 1200 includes a plurality of switches 1204a-1204d, which may be arranged in a network. In some cases, the switches are arranged in a multi-layered network, such as a Clos network. A network device that filters and forwards packets between local area network (LAN) segments may be referred to as a switch. Switches generally operate at the data link layer (layer 2) and sometimes the network layer (layer 3) of the Open System Interconnect (OSI) Reference Model and may support several packet protocols. Switches 1204a-1204d may be connected to a plurality of nodes 1202a-1202h and provide multiple paths between any two nodes.

The network 1200 may also include one or more network devices for connection with other networks 1208, such as other subnets, LANs, wide area networks (WANs), or the Internet, and may be referred to as routers 1206. Routers use headers and forwarding tables to determine the best path for forwarding the packets, and use protocols such as internet control message protocol (ICMP) to communicate with each other and configure the best route between any two devices.

In some examples, network(s) 1200 may include any one or a combination of many different types of networks, such as cable networks, the Internet, wireless networks, cellular networks and other private and/or public networks. Interconnected switches 1204a-1204d and router 1206, if present, may be referred to as a switch fabric, a fabric, a network fabric, or simply a network. In the context of a computer network, terms "fabric" and "network" may be used interchangeably herein.

Nodes 1202a-1202h may be any combination of host systems, processor nodes, storage subsystems, and I/O chassis that represent user devices, service provider computers or third party computers.

User devices may include computing devices to access an application 1232 (e.g., a web browser or mobile device application). In some aspects, the application 1232 may be hosted, managed, and/or provided by a computing resources service or service provider. The application 1232 may allow the user(s) to interact with the service provider computer(s) to, for example, access web content (e.g., web pages, music, video, etc.). The user device(s) may be a computing device such as for example a mobile phone, a smart phone, a personal digital assistant (PDA), a laptop computer, a netbook computer, a desktop computer, a thin-client device, a tablet computer, an electronic book (e-book) reader, a gaming console, etc. In some examples, the user device(s) may be in communication with the service provider computer(s) via the other network(s) 1208. Additionally, the user device(s) may be part of the distributed system managed by, controlled by, or otherwise part of the service provider computer(s) (e.g., a console device integrated with the service provider computers).

The node(s) of FIG. 12 may also represent one or more service provider computers. One or more service provider computers may provide a native application that is configured to run on the user devices, which user(s) may interact with. The service provider computer(s) may, in some examples, provide computing resources such as, but not limited to, client entities, low latency data storage, durable data storage, data access, management, virtualization, cloud-based software solutions, electronic content performance management, and so on. The service provider computer(s) may also be operable to provide web hosting, databasing, computer application development and/or implementation platforms, combinations of the foregoing or the like to the user(s). In some embodiments, the service provider computer(s) may be provided as one or more virtual machines implemented in a hosted computing environment. The hosted computing environment may include one or more rapidly provisioned and released computing resources. These computing resources may include computing, networking and/or storage devices. A hosted computing environment may also be referred to as a cloud computing environment. The service provider computer(s) may include one or more servers, perhaps arranged in a cluster, as a server farm, or as individual servers not associated with one another and may host the application 1232 and/or cloud-based software services. These servers may be configured as part of an integrated, distributed computing environment. In some aspects, the service provider computer(s) may, additionally or alternatively, include computing devices such as for example a mobile phone, a smart phone, a personal digital assistant (PDA), a laptop computer, a desktop computer, a netbook computer, a server computer, a thin-client device, a tablet computer, a gaming console, etc. In some instances, the service provider computer(s) may communicate with one or more third party computers.

In one example configuration, the node(s) 1202a-1202h may include at least one memory 1218 and one or more processing units (or processor(s) 1220). The processor(s) 1220 may be implemented in hardware, computer-executable instructions, firmware, or combinations thereof. Computer-executable instruction or firmware implementations of the processor(s) 1220 may include computer-executable or machine-executable instructions written in any suitable programming language to perform the various functions described.

In some instances, the hardware processor(s) 1220 may be a single core processor or a multi-core processor. A multi-core processor may include multiple processing units within the same processor. In some embodiments, the multi-core processors may share certain resources, such as buses and second or third level caches. In some instances, each core in a single or multi-core processor may also include multiple executing logical processors (or executing threads). In such a core (e.g., those with multiple logical processors), several stages of the execution pipeline and also lower level caches may also be shared.

The memory 1218 may store program instructions that are loadable and executable on the processor(s) 1220, as well as data generated during the execution of these programs. Depending on the configuration and type of the node(s) 1202a-1202h, the memory 1218 may be volatile (such as RAM) and/or non-volatile (such as ROM, flash memory, etc.). The memory 1218 may include an operating system 1228, one or more data stores 1230, one or more applications 1232, one or more drivers 1234, and/or services for implementing the features disclosed herein.

The operating system 1228 may support nodes 1202a-1202h basic functions, such as scheduling tasks, executing applications, and/or controller peripheral devices. In some implementations, a service provider computer may host one or more virtual machines. In these implementations, each virtual machine may be configured to execute its own operating system. Examples of operating systems include Unix, Linux, Windows, Mac OS, iOS, Android, and the like. The operating system 1228 may also be a proprietary operating system.

The data stores 1230 may include permanent or transitory data used and/or operated on by the operating system 1228, applications 1232, or drivers 1234. Examples of such data include web pages, video data, audio data, images, user data, and so on. The information in the data stores 1230 may, in some implementations, be provided over the network(s) 1208 to user devices 1204. In some cases, the data stores 1230 may additionally or alternatively include stored application programs and/or drivers. Alternatively or additionally, the data stores 1230 may store standard and/or proprietary software libraries, and/or standard and/or proprietary application user interface (API) libraries. Information stored in the data stores 1230 may be machine-readable object code, source code, interpreted code, or intermediate code.

The drivers 1234 include programs that may provide communication between components in a node. For example, some drivers 1234 may provide communication between the operating system 1228 and additional storage 1222, network device 1224, and/or I/O device 1226. Alternatively or additionally, some drivers 1234 may provide communication between applications 1232 and the operating system 1228, and/or applications 1232 and peripheral devices accessible to the service provider computer. In many cases, the drivers 1234 may include drivers that provide well-understood functionality (e.g., printer drivers, display drivers, hard disk drivers, Solid State Device drivers). In other cases, the drivers 1234 may provide proprietary or specialized functionality.

The service provider computer(s) or servers may also include additional storage 1222, which may include removable storage and/or non-removable storage. The additional storage 1222 may include magnetic storage, optical disks, solid state disks, flash memory, and/or tape storage. The additional storage 1222 may be housed in the same chassis as the node(s) 1202a-1202h or may be in an external enclosure. The memory 1218 and/or additional storage 1222 and their associated computer-readable media may provide non-volatile storage of computer-readable instructions, data structures, program modules, and other data for the computing devices. In some implementations, the memory 1218 may include multiple different types of memory, such as SRAM, DRAM, or ROM.

The memory 1218 and the additional storage 1222, both removable and non-removable, are examples of computer-readable storage media. For example, computer-readable storage media may include volatile or non-volatile, removable or non-removable media implemented in a method or technology for storage of information, the information including, for example, computer-readable instructions, data structures, program modules, or other data. The memory 1218 and the additional storage 1222 are examples of computer storage media. Additional types of computer storage media that may be present in the node(s) 1202a-1202h may include, but are not limited to, PRAM, SRAM, DRAM, RAM, ROM, EEPROM, flash memory or other memory technology, CD-ROM, DVD or other optical storage, magnetic cassettes, magnetic tape, magnetic disk storage or other magnetic storage devices, solid state drives, or some other medium which can be used to store the desired information and which can be accessed by the node(s) 1202a-1202h. Computer-readable media also includes combinations of any of the above media types, including multiple units of one media type.

Alternatively or additionally, computer-readable communication media may include computer-readable instructions, program modules or other data transmitted within a data signal, such as a carrier wave or other transmission. However, as used herein, computer-readable storage media does not include computer-readable communication media.

The node(s) 1202a-1202h may also include I/O device(s) 1226, such as a keyboard, a mouse, a pen, a voice input device, a touch input device, a display, speakers, a printer, and the like. The node(s) 1202a-1202h may also include one or more communication channels 1236. A communication channel 1236 may provide a medium over which the various components of the node(s) 1202a-1202h can communicate. The communication channel or channels 1236 may take the form of a bus, a ring, a switching fabric, or a network.

The node(s) 1202a-1202h may also contain network device(s) 1224 that allow the node(s) 1202a-1202h to communicate with a stored database, another computing device or server, user terminals and/or other devices on the network(s) 1200. The network device(s) 1224 of FIG. 12 may include similar components discussed with reference to computer system 1100 of FIG. 11.

In some implementations, the network device 1224 is a peripheral device, such as a PCI-based device. In these implementations, the network device 1224 includes a PCI interface for communicating with a host device. The term "PCI" or "PCI-based" may be used to describe any protocol in the PCI family of bus protocols, including the original PCI standard, PCI-X, Accelerated Graphics Port (AGP), and PCI-Express(PCIe) or any other improvement or derived protocols that are based on the PCI protocols discussed herein. The PCI-based protocols are standard bus protocols for connecting devices, such as a local peripheral device to a host device. A standard bus protocol is a data transfer protocol for which a specification has been defined and adopted by various manufacturers. Manufacturers ensure that compliant devices are compatible with computing systems implementing the bus protocol, and vice versa. As used herein, PCI-based devices also include devices that communicate using Non-Volatile Memory Express (NVMe). NVMe is a device interface specification for accessing non-volatile storage media attached to a computing system using PCIe. For example, the bus interface module 1108 may implement NVMe, and the network device 1224 may be connected to a computing system using a PCIe interface.

A PCI-based device may include one or more functions. A "function" describes operations that may be provided by the network device 1224. Examples of functions include mass storage controllers, network controllers, display controllers, memory controllers, serial bus controllers, wireless controllers, and encryption and decryption controllers, among others. In some cases, a PCI-based device may include more than one function. For example, a PCI-based device may provide a mass storage controller and a network adapter. As another example, a PCI-based device may provide two storage controllers, to control two different storage resources. In some implementations, a PCI-based device may have up to eight functions.

In some implementations, the network device 1224 may include single-root I/O virtualization (SR-IOV). SR-IOV is an extended capability that may be included in a PCI-based device. SR-IOV allows a physical resource (e.g., a single network interface controller) to appear as multiple resources (e.g., sixty-four network interface controllers). Thus, a PCI-based device providing a certain functionality (e.g., a network interface controller) may appear to a device making use of the PCI-based device to be multiple devices providing the same functionality. The functions of an SR-IOV-capable storage adapter device may be classified as physical functions (PFs) or virtual functions (VFs). Physical functions are fully featured functions of the device that can be discovered, managed, and manipulated. Physical functions have configuration resources that can be used to configure or control the storage adapter device. Physical functions include the same configuration address space and memory address space that a non-virtualized device would have. A physical function may have a number of virtual functions associated with it. Virtual functions are similar to physical functions, but are light-weight functions that may generally lack configuration resources, and are generally controlled by the configuration of their underlying physical functions. Each of the physical functions and/or virtual functions may be assigned to a respective thread of execution (such as for example, a virtual machine) running on a host device.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 11, FIG. 12, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A memory controller for a storage-class memory, the memory controller comprising:
    a transaction order control circuit configured to:
        receive transaction requests for reading from or writing to the storage-class memory; and
        reorder the received transaction requests;
    a command generation circuit configured to generate transaction commands to the storage-class memory for the reordered transaction requests; and
    a performance monitoring circuit at an interface between the command generation circuit and the storage-class memory, wherein the performance monitoring circuit is configured to:
        receive the transaction commands for the reordered transaction requests from the command generation circuit;
        measure statistics associated with the transaction commands by measuring:
            an active time period during which the statistics associated with the transaction commands are measured; and
            a stall time period within the active period during which a corresponding transaction command for at least one transaction request received by the memory controller has not been sent to the storage-class memory and no transaction command is at the interface between the memory controller and the storage-class memory; and
        determine a utilization rate of the storage-class memory based on the statistics.

2. The memory controller of claim 1, wherein the transaction order control circuit is configured to reorder, based on the determined utilization rate of the storage-class memory, transaction requests received after the utilization rate is determined.

3. The memory controller of claim 1, wherein the performance monitoring circuit comprises:
    an active cycle counter configured to measure the active time period;
    a stall cycle counter configured to measure the stall time period;
    a read access counter configured to count a total number of read operations performed by the storage-class memory during the active time period; or
    a write access counter configured to count a total number of write operations performed by the storage-class memory during the active time period.

4. The memory controller of claim 3, wherein the utilization rate of the storage-class memory is determined by:

(the active time period−the stall time period)÷(the active time period)×100%;

$$\frac{(\text{the total number of read operations} + \text{the total number of read operations}) \times T_{command}}{\text{active time period}} \times 100\%;$$

or $$\frac{(\text{the total number of read operations} + \text{the total number of read operations}) \times T_{command}}{(\text{the total number of read operations} + \text{the total number of read operations}) \times T_{command} + \text{the stall time period}} \times 100\%,$$

wherein $T_{command}$ is a time period of a transaction command.

5. A computer-implemented method, comprising:
receiving, at an interface between a memory controller and a storage-class memory (SCM), transaction commands from the memory controller to the storage-class memory, each of the transaction commands corresponding to an operation on the storage-class memory;
measuring statistics associated with the transaction commands by measuring:
  an active time period during which the statistics associated with the transaction commands are measured; and
  a stall time period within the active period during which a corresponding transaction command for at least one transaction request received by the memory controller has not been sent to the storage-class memory and no transaction command is at the interface between the memory controller and the storage-class memory; and
determining a utilization rate of the storage-class memory based on the statistics.

6. The computer-implemented method of claim 5, wherein measuring the statistics associated with the transaction commands further comprises:
measuring a total number of read operations performed by the storage-class memory during the active time period; or
measuring a total number of write operations performed by the storage-class memory during the active time period.

7. The computer-implemented method of claim 5, wherein measuring the stall time period comprises:
starting a clock counter at the beginning of the active time period;
counting, by the clock counter during the active time period, a number of clock cycles during which a transaction command for at least one transaction request received by the memory controller has not been sent to the storage-class memory but there is no transaction command at the interface between the memory controller and the storage-class memory;
stopping the clock counter at the end of the active time period;
saving a counter value of the clock counter; and
resetting the clock counter.

8. The computer-implemented method of claim 6, wherein the utilization rate of the storage-class memory is determined by:

(the active time period−the stall time period)÷(the active time period)×100%;

$$\frac{(\text{the total number of read operations} + \text{the total number of read operations}) \times T_{command}}{\text{active time period}} \times 100\%;$$

or $$\frac{(\text{the total number of read operations} + \text{the total number of read operations}) \times T_{command}}{(\text{the total number of read operations} + \text{the total number of read operations}) \times T_{command} + \text{the stall time period}} \times 100\%,$$

wherein $T_{command}$ is a time period of a transaction command.

9. The computer-implemented method of claim 5, wherein measuring the statistics associated with the transaction commands comprises:
measuring the statistics associated with the transaction commands during a time period specified by a timer.

10. The computer-implemented method of claim 5, further comprising:
enabling, using a register, a performance monitoring circuit for measuring the statistics.

11. The computer-implemented method of claim 5, further comprising:
receiving, after determining the utilization rate, transaction requests for reading from or writing to the storage-class memory; and
reordering the received transaction requests based on the determined utilization rate of the storage-class memory.

12. The computer-implemented method of claim 11, wherein reordering the received transaction requests comprises:
performing two read or write transactions on different cells of a bank of the storage-class memory; and
programming the bank of the storage-class memory to persist data written to the bank.

13. The computer-implemented method of claim 11, wherein reordering the received transaction requests comprises:
programming a bank of the storage-class memory to persist data written to the bank; and
performing, before the programming of the bank of the storage-class memory completes, a read or write transaction on a different bank of the storage-class memory.

14. The computer-implemented method of claim 11, wherein reordering the received transaction requests comprises:
performing two write transactions on different cells of a first bank of the storage-class memory;
performing two write transactions on different cells of a second bank of the storage-class memory;
programming the first bank of the storage-class memory to persist data written to the first bank; and
programming, before the programming of the first bank of the storage-class memory completes, the second bank of the storage-class memory to persist data written to the second bank.

15. The computer-implemented method of claim 5, further comprising:
receiving, after determining the utilization rate, transaction requests for reading from or writing to the storage-class memory; and
mapping the received transaction requests to SCM banks or SCM channels based on the determined utilization rate of the storage-class memory.

16. The computer-implemented method of claim 5, further comprising:
   reading, by a software application, the measured statistics or the determined utilization rate of the storage-class memory; and
   determining, by the software application, an order of transaction requests to be sent to the storage-class memory based on the measured statistics or the determined utilization rate of the storage-class memory.

17. A memory controller for a storage-class memory (SCM), the memory controller comprising:
   a performance monitoring circuit at an interface between the memory controller and the storage-class memory, wherein the performance monitoring circuit is configured to:
      receive transaction commands from the memory controller to the storage-class memory, each of the transaction commands corresponding to an operation on the storage-class memory;
      measure statistics associated with the transaction commands by measuring:
         an active time period during which the statistics associated with the transaction commands are measured; and
         a stall time period within the active period during which a corresponding transaction command for at least one transaction request received by the memory controller has not been sent to the storage-class memory and no transaction command is at the interface between the memory controller and the storage-class memory; and
      determine a utilization rate of the storage-class memory based on the statistics.

18. The memory controller of claim 17, wherein the performance monitoring circuit comprises:
   a counter configured to measure:
      the active time period;
      the stall time period;
      a total number of read operations performed by the storage-class memory during the active time period; or
      a total number of write operations performed by the storage-class memory during the active time period; and
   a counter control circuit configured to enable or disable the counter.

19. The memory controller of claim 17, wherein the memory controller is coupled to two individually programmable SCM banks of the storage-class memory.

20. The memory controller of claim 19, wherein each bank of the two individually programmable SCM banks comprises two individually addressable SCM cells.

* * * * *